US012371782B2

(12) United States Patent
Okuno et al.

(10) Patent No.: US 12,371,782 B2
(45) Date of Patent: Jul. 29, 2025

(54) METHOD OF MANUFACTURING SEMICONDUCTOR DEVICE AND NON-TRANSITORY COMPUTER-READABLE RECORDING MEDIUM

(71) Applicant: KOKUSAI ELECTRIC CORPORATION, Tokyo (JP)

(72) Inventors: Masanori Okuno, Toyama (JP); Tatsuya Yotsutani, Toyama (JP); Masaya Nagato, Toyama (JP); Toshihiko Yonejima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/884,854

(22) Filed: May 27, 2020

(65) Prior Publication Data

US 2020/0381268 A1    Dec. 3, 2020

(30) Foreign Application Priority Data

May 28, 2019   (JP) .................................. 2019-099619
Apr. 3, 2020   (JP) .................................. 2020-067600

(51) Int. Cl.
*C23C 16/44*    (2006.01)
*B08B 5/00*     (2006.01)
(Continued)

(52) U.S. Cl.
CPC ............ *C23C 16/4405* (2013.01); *B08B 5/00* (2013.01); *B08B 9/027* (2013.01);
(Continued)

(58) Field of Classification Search
CPC ............ C23C 16/4405; C23C 16/4408; C23C 16/4412; C23C 16/00–56;
(Continued)

(56) References Cited

U.S. PATENT DOCUMENTS

2005/0161158 A1\*   7/2005   Schumacher .......... B01D 46/24
                                                    156/345.29
2007/0095282 A1\*   5/2007   Moon ................... B08B 7/0035
                                                    118/715
(Continued)

FOREIGN PATENT DOCUMENTS

CN      109473338 A     3/2019
JP      2001-012379 A   1/2001
(Continued)

OTHER PUBLICATIONS

"exhaust, n." OED Online, Oxford University Press, retrieved from www.oed.com/view/Entry/66154. (Year: 2023).*
(Continued)

*Primary Examiner* — Michael E Barr
*Assistant Examiner* — Richard Z. Zhang
(74) *Attorney, Agent, or Firm* — Volpe Koenig

(57) ABSTRACT

Described herein is a technique capable of removing by-products before the by-products are deposited to an exhaust part. According to one aspect of the technique, there is provided a method of manufacturing a semiconductor device including: (a) processing a substrate while maintaining an inner pressure of a process chamber at a process pressure by adjusting a valve configured to adjust the inner pressure of the process chamber; (b) changing the inner pressure of the process chamber from the process pressure to an atmospheric pressure; and (c) supplying a predetermined gas to a downstream side of the valve to bypass the process chamber while performing (b).

19 Claims, 8 Drawing Sheets

(51) Int. Cl.
    *B08B 9/027* (2006.01)
    *B08B 9/032* (2006.01)
    *H01L 21/67* (2006.01)

(52) U.S. Cl.
    CPC .... *C23C 16/4412* (2013.01); *H01L 21/67017* (2013.01); *B08B 9/0328* (2013.01); *C23C 16/4408* (2013.01)

(58) Field of Classification Search
    CPC ....... H01L 21/67242–67294; H01L 21/67017; H01L 21/02104; H01J 37/32834; H01J 2237/3321; H01J 2237/335; B08B 9/027; B08B 9/0328; B08B 2209/027; B08B 5/00
    See application file for complete search history.

(56) References Cited

U.S. PATENT DOCUMENTS

| | | | |
|---|---|---|---|
| 2012/0226475 A1* | 9/2012 | Asai | G05B 19/4184 702/179 |
| 2013/0164943 A1 | 6/2013 | Koshi et al. | |
| 2015/0096494 A1 | 4/2015 | Nishiura et al. | |
| 2015/0176130 A1 | 6/2015 | Koshi et al. | |
| 2015/0292082 A1* | 10/2015 | Sano | H01L 21/02186 438/5 |
| 2018/0120822 A1* | 5/2018 | Asai | C23C 16/52 |
| 2018/0144953 A1* | 5/2018 | Yonejima | H01L 21/6719 |
| 2019/0078198 A1 | 3/2019 | Umehara et al. | |
| 2019/0080888 A1 | 3/2019 | Ikenaga et al. | |
| 2019/0080936 A1 | 3/2019 | Ozaki | |
| 2020/0370175 A1* | 11/2020 | Tanabe | C23C 16/4405 |

FOREIGN PATENT DOCUMENTS

| | | |
|---|---|---|
| JP | 2003-273081 A | 9/2003 |
| JP | 2013-153159 A | 8/2013 |
| JP | 2019-050246 A | 3/2019 |
| KR | 10-2013-0075677 A | 7/2013 |
| KR | 10-2019-0028326 A | 3/2019 |
| WO | 2013/146595 A1 | 10/2013 |

OTHER PUBLICATIONS

Singapore Office Action issued on Feb. 11, 2021 for Singapore Patent Application No. 10202004943S.
Japanese Office Action issued on Apr. 20, 2021 for Japanese Patent Application No. 2020-067600.
Taiwanese Office Action issued on Feb. 5, 2021 for Taiwanese Patent Application No. 109112812.
Korean Office Action issued on Jan. 17, 2022 for Korean Patent Application No. 10-2020-0062381.
Chinese Office Action issued on Jul. 25, 2023 for Chinese Patent Application No. 202010445863.5.
Korean Office Action issued on Nov. 21, 2023 for Korean Patent Application No. 10-2023-0138358.

* cited by examiner

| EVENT | APC VALVE 242 | CLEANING GAS | |
|---|---|---|---|
| | | TIME(MIN'SEC") | STATE |
| ⋮ | ⋮ | ⋮ | ⋮ |
| FIRST APRS | CLOSED | 1'00" | DEPRESSURIZED |
| SECOND APRS | CLOSED | 10'00" | SUPPLY |
| THIRD APRS | CLOSED | 2'10" | DEPRESSURIZED |
| FOURTH APRS | CLOSED | 1'30" | PURGING |
| BOAT UNLOADING STEP | CLOSED | 8'00" | OFF |
| END | CLOSED | | |

| ALARM COUNTER | FLOW RATE OF CLEANING GAS |
|---|---|
| 1ST | α |
| 2ND | β |
| 3RD | γ |

METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2019-099619, filed on May 28, 2019, and Japanese Patent Application No. 2020-067600, filed on Apr. 3, 2020, the entire contents of which are hereby incorporated by reference.

BACKGROUND

1. Field

The present disclosure relates to a method of manufacturing a semiconductor device and a non-transitory computer-readable recording medium.

2. Related Art

According to conventional processes of manufacturing a semiconductor device, an influence of a conductance of an exhaust pipe of an apparatus such as a substrate processing apparatus was not so significant. However, according to recent processes related to a large-area three-dimensional device (also referred to as a "3D device"), it is important to improve an exhaust performance of the apparatus.

For example, according to related arts, a cleaning technique may be performed by supplying a cleaning gas into an exhaust part (also referred to as an "exhaust system" an "exhaust mechanism") of the apparatus without passing through a process chamber of the apparatus to clean the exhaust pipe. According to another related arts, a cleaning recipe of removing an accumulated film deposited on the exhaust pipe may be performed when a thickness of the accumulated film deposited on the exhaust pipe reaches a threshold value.

However, the cleaning technique or the cleaning recipe may be performed only after a state of the exhaust part becomes abnormal. Therefore, an operation rate of the apparatus may be reduced due to a maintenance operation of the exhaust p art.

SUMMARY

Described herein is a technique capable of removing by-products before the by-products are deposited to an exhaust part.

According to one aspect of the technique of the present disclosure, there is provided a method of manufacturing a semiconductor device including: (a) processing a substrate while maintaining an inner pressure of a process chamber at a process pressure by adjusting a valve configured to adjust the inner pressure of the process chamber; (b) changing the inner pressure of the process chamber from the process pressure to an atmospheric pressure; and (c) supplying a predetermined gas to a downstream side of the valve to bypass the process chamber while performing (b).

DETAILED DESCRIPTION

Embodiments

Hereinafter, one or more embodiments (also simply referred to as "embodiments") according to the technique of the present disclosure will be described with reference to the drawings.

(1) Configuration of Substrate Processing Apparatus

Hereinafter, a substrate processing apparatus 100 preferably used in the embodiments will be described with reference to FIGS. 1 and 2.

Figure 1:
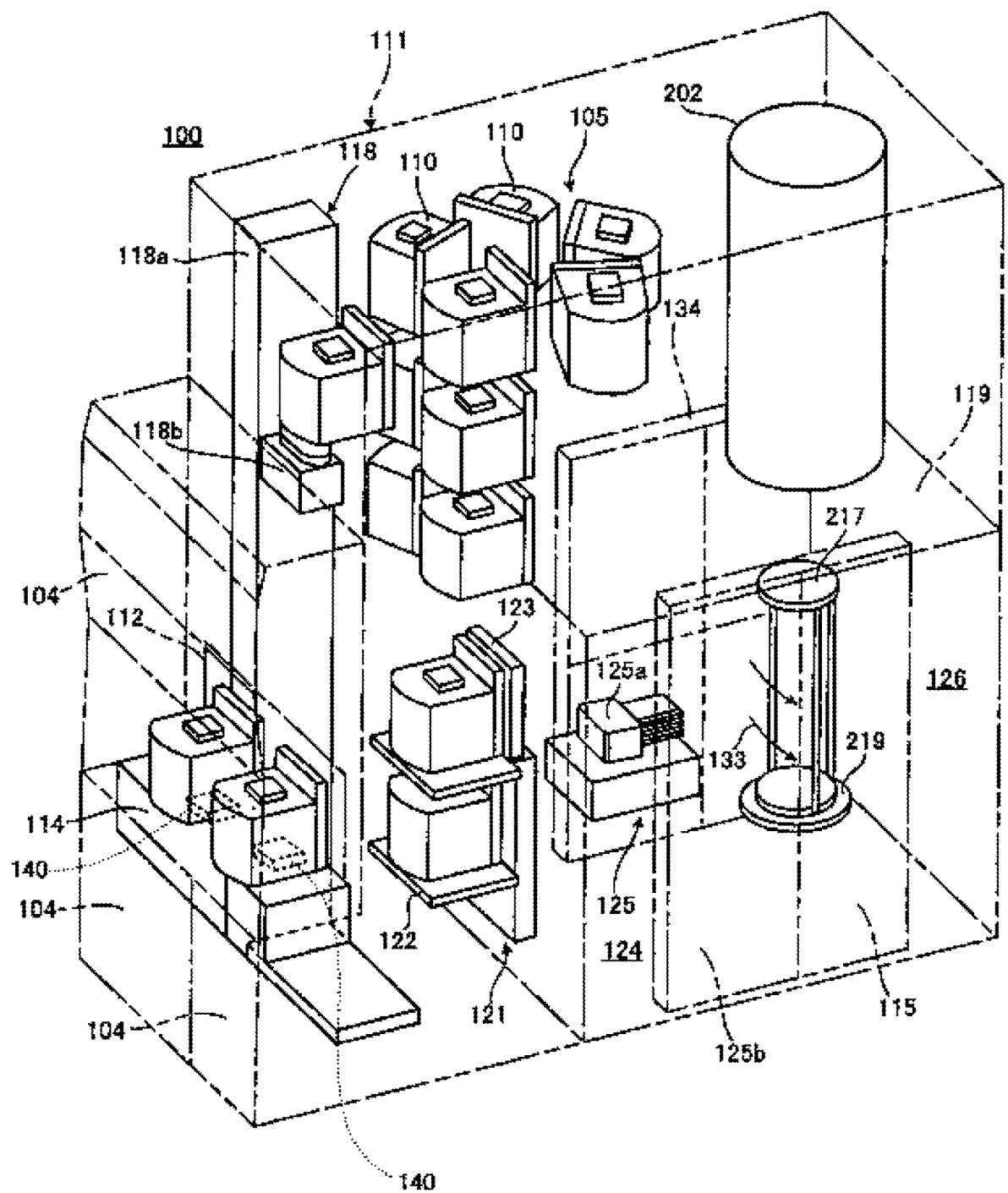
FIG. 1 is a perspective view schematically illustrating a substrate processing apparatus preferably used in one or more embodiments described herein.

As shown in FIG. 1, the substrate processing apparatus 100 includes a housing 111 configured as a pressure resistant container. An opening portion is provided at a front wall of the housing 111 in order to maintain the substrate processing apparatus 100. A pair of front doors 104 is provided at the opening portion. The pair of front doors 104 functions as an opening/closing mechanism configured to open or close the opening portion. A pod 110 serving as a substrate container capable of accommodating a plurality of wafers (also simply referred to as "wafers") including a wafer (hereinafter, also referred to as a "substrate") 200 such as a silicon wafer is used as a carrier to transfer the wafers including the wafer 200 into or out of the housing 111.

A pod loading/unloading port 112 is provided at the front wall of the housing 111. The pod 110 may be transferred (loaded) into or transferred (unloaded) out of the housing 111 through the pod loading/unloading port 112. A loading port (also referred to as a "loading port shelf") 114 is provided at the pod loading/unloading port 112. The pod 110 is aligned while placed on the loading port shelf 114.

A rotatable pod shelf 105 is provided over a substantially center portion of the housing 111. The rotatable pod shelf 105 may hold a plurality of pods (also simply referred to as "pods") including the pod 110.

A pod transport device 118 is provided between the loading port shelf 114 and the rotatable pod shelf 105 in the housing 111. For example, the pod transport device 118 is constituted by a pod elevator 118a and a pod transport mechanism 118b. The pod transport device 118 is configured to transport the pod 110 among the loading port shelf 114, the rotatable pod shelf 105 and a pod opener 121 described later by consecutive operations of the pod elevator 118a and the pod transport mechanism 118b.

A sub-housing 119 is provided below the substantially center portion in a front-rear direction in the housing 111 toward a rear end of the substrate processing apparatus 100. A pair of pod openers including the pod opener 121 is provided at a front wall of the sub-housing 119. The wafer 200 may be transferred (loaded) into or transferred (unloaded) out of the sub-housing 119 through the pair of the pod openers. For example, an upper pod opener and a lower pod opener may be provided as the pair of the pod openers. The upper pod opener and the lower pod opener may be collectively or individually referred to as the "pod opener 121". The upper pod opener may also be referred to as the upper pod opener 121, and the lower pod opener may also be referred to as the lower pod opener 121.

The pod opener 121 includes a placement table 122 where the pod 110 is placed thereon and a cap attaching/detaching mechanism 123 configured to attach or detach a cap of the pod 110. By detaching or attaching the cap of the pod 110 placed on the placement table 122 by the pod opener 121, a wafer entrance of the pod 110 is opened or closed.

The sub-housing 119 defines a transfer chamber 124 fluidically isolated from an installation space in which components such as the pod transport device 118 is provided. A wafer transport mechanism 125 is provided in a front region of the transfer chamber 124. For example, the wafer transport mechanism 125 is constituted by a wafer transport device 125a and a wafer transport device elevator 125b. The wafer transport device 125a is configured to rotate or move the wafer 200 horizontally. The wafer transport device elevator 125b is configured to elevate or lower the wafer transport device 125a. The wafer transport mechanism 125 may load (charge) or unload (discharge) the wafer 200 into or out of a boat 217 serving as a substrate retainer by consecutive operations of the wafer transport device elevator 125b and the wafer transport device 125a.

Figure 2:
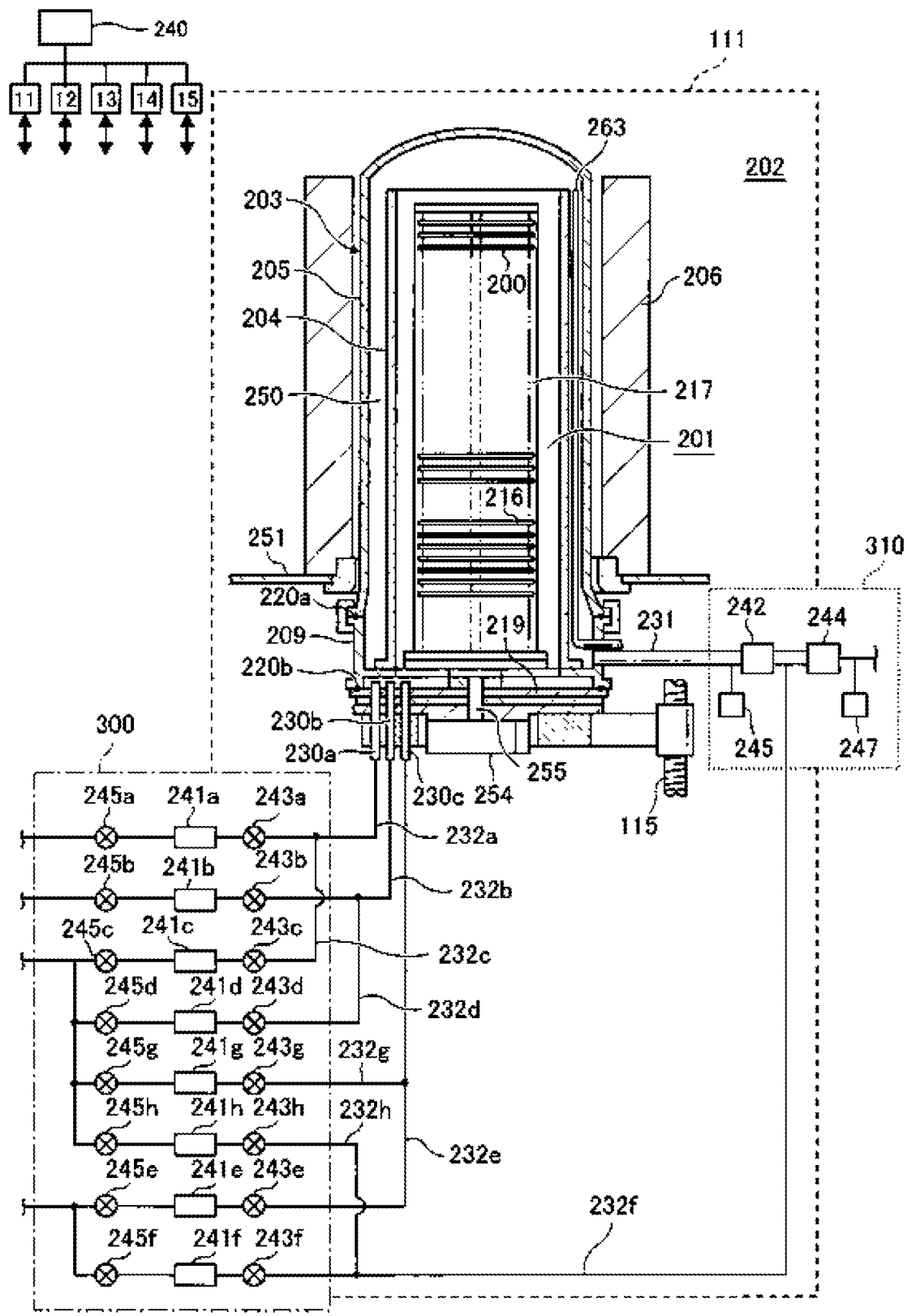
FIG. 2 schematically illustrates a vertical cross-section of a process furnace of the substrate processing apparatus preferably used in the embodiments described herein.

As shown in FIGS. 1 and 2, a boat elevator 115 is provided in the sub-housing 119. The boat elevator 115 is configured to elevate or lower the boat 217. A process furnace 202 is provided above a standby space 126 where the boat 217 is accommodated and in standby. An arm (not shown) is connected to an elevating table (not shown) of the boat elevator 115. A lid 219 is provided horizontally at an arm 128. The lid 219 is configured to support the boat 217 vertically and to close a lower end of the process furnace 202.

(2) Configuration of Process Furnace

As shown in FIG. 2, the process furnace 202 includes a process tube 203 serving as a reaction tube. The process tube 203 includes an inner tube 204 serving as an inner reaction tube and an outer tube 205 serving as an outer reaction tube and provided outside the inner tube 204. The inner tube 204 is of a cylindrical shape with open upper and lower ends. A process chamber 201 where the wafers including the wafer 200 are processed is provided in a hollow portion of the inner tube 204. The process chamber 201 is configured to accommodate the boat 217.

A heater 206 is provided outside the process tube 203 to surround a side wall of the process tube 203. The heater 206 is of a cylindrical shape. The heater 206 is vertically supported by a heater base 251 serving as a support plate.

A manifold 209 serving as a furnace opening portion is provided under the outer tube 205. The outer tube 205 and the manifold 209 are concentrically arranged. The manifold 209 is of a cylindrical shape with open upper and lower ends. An O-ring 220a serving as a sealing part is provided between the manifold 209 and the outer tube 205. By supporting the manifold 209 on the heater base 251, the process tube 203 is vertically provided. A reaction vessel is constituted by the process tube 203, the manifold 209 and the lid 219, and the process chamber 201 is provided in the reaction vessel.

An O-ring 220b serving as a sealing part is provided on an upper surface of the lid 219. For example, the O-ring 220b is in contact with the lower end of the manifold 209.

A rotating mechanism 254 configured to rotate the boat 217 is provided about a center portion of the lid 219 opposite to the process chamber 201. The rotating mechanism 254 is capable of rotating the wafers including the wafer 200 by rotating the boat 217.

The lid 219 may be elevated or lowered in the vertical direction by the boat elevator 115 provided outside the process tube 203. When the lid 219 is elevated or lowered by the boat elevator 115, the boat 217 may be loaded into the process chamber 201 or unloaded out of the process chamber 201.

A transfer mechanism (also referred to as a "transfer system") according to the embodiments is constituted mainly by the rotatable pod shelf 105, the boat elevator 115, the pod transport device 118, the wafer transport mechanism 125, the boat 217 and the rotating mechanism 254. Each of the components constituting the transfer mechanism is electrically connected to a transfer controller 11.

The boat 217 is configured to support the wafers including the wafer 200 in a multistage manner. Insulating plates 216 serving as an insulating part are provided under the boat 217. The insulating plates 216 are arranged in a horizontal orientation in a multistage manner.

A temperature sensor 263 serving as a temperature detector is provided in the process tube 203. A heating mechanism according to the embodiments is constituted mainly by the heater 206 and the temperature sensor 263. A temperature controller 12 is electrically connected to the heater 206 and the temperature sensor 263.

Nozzles 230a, 230b and 230c are connected to the manifold 209 so as to communicate with the process chamber 201. Gas supply pipes 232a, 232b and 232e are connected to the nozzles 230a, 230b and 230c, respectively.

Gas supply sources (that is, a process gas supply source (not shown) and a reactive gas supply source (not shown)), valves 245a and 245b, mass flow controllers (MFCs) 241a and 241b and valves 243a and 243b are provided at the gas supply pipes 232a and 232b, respectively, in order from upstream sides to downstream sides of the gas supply pipes 232a and 232b. Gas supply pipes 232c and 232d are connected to downstream sides of the valves 243a and 243b of the gas supply pipes 232a and 232b, respectively. Purge gas supply sources (not shown), valves 245c and 245d, MFCs 241c and 241d and valves 243c and 243d are provided at the gas supply pipes 232c and 232d, respectively, in order from upstream sides to downstream sides of the gas supply pipes 232c and 232d.

A cleaning gas supply source (not shown), a valve 245e, a mass flow controller (MFC) 241e and a valve 243e are provided at the gas supply pipe 232e in order from an upstream side to a downstream side of the gas supply pipe 232e. A gas supply pipe 232f is connected to the gas supply pipe 232e at an upstream side of the valve 245e. A valve 245f, an MFC 241f and a valve 243f are provided at the gas supply pipe 232f in order from an upstream side to a downstream side of the gas supply pipe 232f. The downstream side of the gas supply pipe 232f is connected to an upstream side of an auxiliary pump (hereinafter, also simply referred to as a "pump") 244 and a downstream side of an APC (Automatic Pressure Controller) valve 242. The pump 244 serves as an exhaust device of an exhaust part (also referred to as an "exhaust system") 310, and the APC valve 242 serves as a pressure adjusting device configured to adjust a pressure such as an inner pressure of the process chamber 201. Gas supply pipes 232g and 232h are connected to downstream sides of the valves 243e and 243f of the gas supply pipes 232e and 232f, respectively. Purge gas supply sources (not shown), valves 245g and 245h, MFCs 241g and 241h and valves 243g and 243h are provided at the gas supply pipes 232g and 232h, respectively, in order from upstream sides to downstream sides of the gas supply pipes 232g and 232h.

The embodiments are not limited to the configurations described above. For example, the gas supply pipe 232f may be connected to an upstream side of the APC valve 242. For example, instead of connecting the gas supply pipe 232f to the upstream side of the APC valve 242, a part of the gas supply pipe 232f may be provided at the upstream side of the APC valve 242 and a part of the gas supply pipe 232f may be provided at the downstream side of the APC valve 242 and the upstream side of the pump 244.

A process gas supply system according to the embodiments is constituted mainly by the process gas supply source (not shown), the valve 245a, the MFC 241a, the valve 243a, the gas supply pipe 232a and the nozzle 230a. A reactive gas supply system according to the embodiments is constituted mainly by the reactive gas supply source (not shown), the valve 245b, the MFC 241b, the valve 243b, the gas supply pipe 232b and the nozzle 230b. A purge gas supply system according to the embodiments is constituted mainly by the purge gas supply sources (not shown), the valves 245c, 245d, 245g and 245h, the MFCs 241c, 241d, 241g and 241h, the valves 243c, 243d, 243g and 243h, the gas supply pipes 232c, 232d, 232g and 232h and the nozzles 230a and 230b. A cleaning gas supply system according to the embodiments is constituted mainly by the cleaning gas supply source (not shown), the valve 245e, the MFC 241e, the valve 243e, the gas supply pipe 232e and the nozzle 230c. An exhaust cleaning gas supply system according to the embodiments is constituted mainly by the cleaning gas supply source (not shown), the valve 245f, the MFC 241f, the valve 243f, and the gas supply pipe 232f. A gas supply part 300 serving as a gas supply system according to the embodiments is constituted mainly by the process gas supply system, the reactive gas supply system, the purge gas supply system, the cleaning gas supply system and the exhaust cleaning gas supply system. A gas supply controller 14 is electrically connected to the MFCs 241a through 241h, the valves 243a through 243h and the valves 245a through 245h.

An exhaust pipe 231 configured to exhaust an inner atmosphere of the process chamber 201 is provided at the manifold 209. The exhaust pipe 231 is disposed at a lower end portion of a cylindrical space 250 which is defined by a gap between the inner tube 204 and the outer tube 205. A pressure sensor 245 serving as a pressure detector, the APC valve 242, the pump 244, a pressure sensor 247 and a main pump (not shown) serving as a second exhaust device are provided at the exhaust pipe 231 in order from an upstream side (that is, a side of the exhaust pipe 231 where the process chamber 201 is connected) to a downstream side of the exhaust pipe 231. The pump 244 is used to assist an operation of the main pump (not shown). For example, the pump 244 is configured to increase an exhaust speed of exhausting the inner atmosphere of the process chamber 201. For example, a pump such as a booster pump may be used as the pump 244. The pressure sensor 247 is configured to measure a back pressure of the pump 244. For example, when a clogging occurs in the pump 244 or in a portion of the exhaust pipe 231 before or after the pump 244, the pressure sensor 247 is configured to immediately detect the clogging by detecting a change in the detected pressure value. The embodiments are described by way of an example in which the pressure sensor 247 is provided at the downstream side of the pump 244. However, the embodiments are not limited thereto. For example, any sensor capable of detecting an abnormality of the pump 244 may be provided at the downstream side of the pump 244 instead of the pressure sensor 247.

The exhaust part 310 is constituted mainly by the exhaust pipe 231, the pressure sensor 245, the APC valve 242, the pump 244 and the pressure sensor 247. The exhaust part 310 may further include the main pump (not shown). In addition, as shown in FIG. 2, a diameter of the exhaust pipe 231 on the upstream side of the pump 244 is set to be greater than a diameter of the exhaust pipe 231 on the downstream side of the pump 244.

A pressure controller 13 is electrically connected to the APC valve 242 and the pressure sensor 245. An exhaust controller 15 is electrically connected to the pressure sensor 247, the pump 244 and the main pump (not shown).

That is, as shown in FIG. 2, the substrate processing apparatus 100 includes at least a housing 111, the gas supply part 300 and the exhaust part 310.

As shown in FIG. 2, a controller 240 serving as a control device (also referred to as a "control mechanism") is connected to each of the transfer controller 11, the temperature controller 12, the pressure controller 13, the gas supply controller 14 and the exhaust controller 15.

(3) Configuration of Controller

Figure 3:
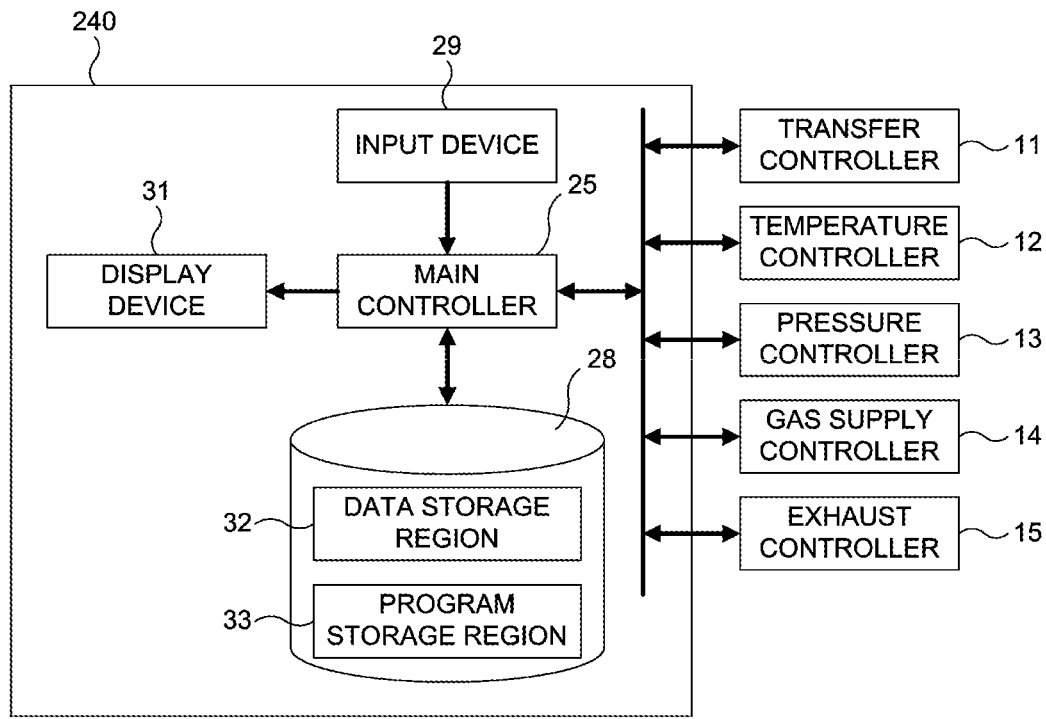
FIG. 3 is a block diagram schematically illustrating a configuration of a controller and related components of the substrate processing apparatus preferably used in the embodiments described herein.

The controller 240 will be described in detail with reference to FIG. 3.

The controller 240 is constituted mainly by a main controller 25 such as a CPU (Central Processing Unit), a memory device 28 such as a memory (RAM) and a hard disk drive (HDD), an input device 29 such as a mouse and a keyboard and a display device 31 such as a monitor. The main controller 25, the memory device 28, the input device 29 and the display device 31 constitute an operation device capable of setting respective data.

The memory device 28 includes a data storage region 32 where various process data such as apparatus data are stored and a program storage region 33 where various programs are stored. In the present specification, the process data refers to data generated by operating components of the substrate processing apparatus 100 when the substrate processing apparatus 100 processes the wafer 200. For example, the process data may include: data on a substrate processing such as a process temperature, a process pressure and a flow rate of a process gas when the substrate processing apparatus 100 processes the wafer 200; data on a quality of a manufactured product substrate (for example, a thickness of a film formed on the wafer 200 and an accumulated thickness of the film); and data such as component data on the components of the substrate processing apparatus 100 (for example, a quartz reaction tube, the heater, the valves and the MFCs). The apparatus data will be described later.

Various programs such as a process recipe and a cleaning recipe required for controlling the operation of the substrate processing apparatus 100 are stored in the program storage region 33.

In the present specification, the process recipe refers to a recipe including a plurality of steps. The process recipe at least includes: the substrate processing (hereinafter, also referred to as a "film-forming process") of processing the wafer 200 while maintaining the pressure such as the inner pressure of the process chamber 201 at the process pressure by opening and closing a valve (or valves) such as the APC valve 242; and an atmospheric pressure returning process (also referred to as an "atmospheric pressure returning step") of adjusting (changing) the inner pressure of the process chamber 201 from the process pressure to the atmospheric pressure. Process conditions and process procedures for processing the wafer 200 may also be defined in the process recipe. According to the embodiments, the process recipe may further include a cleaning step (hereinafter, also referred to as an "exhaust cleaning process"). The exhaust cleaning process includes a step of supplying a cleaning gas serving as a predetermined gas to the downstream side of the APC valve 242 while controlling the leaning gas to bypass the process chamber 201.

Various parameters related to a recipe file such as the process recipe are stored in the data storage region 32. In addition, various process data described above are stored in the data storage region 32. According to the embodiments, among various process data, in particular, the apparatus data indicating a state of the exhaust part 310 while performing the process recipe is accumulated and stored in the data storage region 32. Specifically, data such as an electric current value, a rotation speed and the back pressure of the pump 244 are stored in the data storage region 32 as the apparatus data. In particular, an average value of the apparatus data from a group consisting of the electric current value, the rotation speed and the back pressure of the pump 244 at a predetermined specific step among the steps constituting the process recipe is stored. In addition, monitoring parameters are stored in the data storage region 32. For example, the monitoring parameters are at least defined by: a type of the apparatus data from the group consisting of the electric current value, the rotation speed and the back pressure of the pump 244; a tendency (hereinafter, also referred to as an "abnormal tendency") indicating an abnormality for each type of the apparatus data; and a pre-set value (for example, the number of times) for each type of the apparatus data. Threshold values may also be set as the monitoring parameters for each type of the apparatus data.

For example, the number of times (for example, the pre-set value) set in advance for each type of the apparatus data; the number of times of alarms generated when the abnormal tendency occurs continuously; a pre-set flow rate (hereinafter, also referred to as an "initial flow rate") of the cleaning gas when performing the exhaust cleaning process described later in accordance with the number of times of the alarms generated; and an alarm limit number are stored in the data storage region 32.

Information such as a pre-set value (control value) or a transmission timing to be transmitted to the components such as the transfer controller 11, the temperature controller 12, the pressure controller 13, the gas supply controller 14 and the exhaust controller 15 may be stored in the recipe file, for each step of the process recipe.

A touch panel is provided in the display device 31. The touch panel is configured to display an operation screen configured to receive input of an operation command for the components such as the transfer system of the substrate processing apparatus 100 described above. The operation device described above preferably includes at least the display device 31 and the input device 29. The operation device may be, for example, an operating terminal device such as a computer and a mobile terminal device which includes at least the input device 29 and the display device 31.

The main controller 25 controls parameters such as an inner temperature of the process chamber 201, the inner pressure of the process chamber 201 and the flow rate of the process gas supplied into the process chamber 201 in order to perform a predetermined process (that is, the substrate processing) to the wafer 200 loaded in the process chamber 201. The main controller 25 executes a supply step of supplying the predetermined gas directly to the component such as the exhaust pipe 231 in the exhaust part 310 while controlling the predetermined gas to bypass the process chamber 201 after the predetermined specific step among the steps constituting the process recipe is completed. For example, in the supply step described above, the components constituting the exhaust part 310 such as the exhaust pipe 231 are cleaned.

That is, the main controller 25 executes a control program stored in the memory device 28 and a recipe (for example, the process recipe serving as a substrate processing recipe and the cleaning recipe stored in the memory device 28) in accordance with an input from the input device 29 or an instruction from a higher-level controller such as an external host apparatus. In addition, the main controller 25 controls the components of the substrate processing apparatus 100 to acquire the apparatus data while performing the recipe and to store the acquired apparatus data in the data storage region 32 of the memory device 28. In the present specification, the cleaning recipe refers to a recipe in which information such as process conditions and process procedures for cleaning the components constituting the process chamber 201 where the wafer 200 is processed or the components provided in the process chamber 201 is defined.

Specifically, as the apparatus data at the predetermined specific step constituting the process recipe, data related to the exhaust part 310 configured to exhaust the inner atmosphere of the process chamber 201 is appropriately selected from the group consisting of the electric current value, the rotation speed and the back pressure of the pump 244. That is, at least one apparatus data may be selected from the group consisting of the electric current value, the rotation speed and the back pressure of the pump 244, and the monitoring parameters may be set for the selected apparatus data. For example, a plurality of data from the group consisting of the electric current value, the rotation speed and the back pressure of the pump 244 may be selected as the apparatus data, or a plurality of apparatus data may be selected from the group consisting of the electric current value, the rotation speed and the back pressure of the pump 244.

Then, the main controller 25 adds the at least one apparatus data at regular intervals. As described above, the at least one apparatus data may be selected from the group consisting of the electric current value, the rotation speed and the back pressure of the pump 244 at the predetermined specific step constituting the process recipe. Then, the main controller 25 compares an average value of the apparatus data calculated by adding the at least one apparatus data at the regular intervals with an average value of the apparatus data of the pump 244 at the specific step of a previously performed process recipe. Thereby, the main controller 25 determines whether or not the fluctuation of the average value of the apparatus data indicates the abnormality tendency defined in the monitoring parameters for each type of the apparatus data.

For example, in order to determine the abnormal tendency, the main controller 25 compares the average value of the apparatus data at the specific step of the currently performed process recipe with the average value of the apparatus data at the predetermined specific step of the previously performed process recipe. When the average value of the apparatus data at the specific step of the currently performed process recipe increases by a pre-set value (threshold value) or more than the average value of the apparatus data at the predetermined specific step of the process recipe performed, for example, 10% or more, the main controller 25 determines that the average value of the apparatus data at the specific step of the currently performed process recipe is an increasing tendency. When the average value of the apparatus data at the specific step of the currently performed process recipe decreases by the pre-set value (threshold value) or more than the average value of the apparatus data at the predetermined specific step of the process recipe performed, for example, 10% or more, the main controller 25 determines that the average value of the apparatus data at the specific step of the currently performed process recipe is a decreasing tendency. When the average value of the apparatus data at the specific step of the currently performed process recipe is less than the pre-set value (threshold value), for example, when the fluctuation is less than ±10%, the main controller 25 determines that the average value of the apparatus data at the specific step of the currently performed process recipe involves a non-fluctuation tendency (that is, the average value of the apparatus data at the specific step of the currently performed process recipe indicates an normality).

Then, when the fluctuation of the average value does not involve the abnormal tendency or when the abnormal tendency does not reach the pre-set value continuously (that is, the abnormal tendency indicating the predetermined abnormality occurs less than a pre-set number of times), the main controller 25 executes the exhaust cleaning process while performing the atmospheric pressure returning process. The atmospheric pressure returning process is performed after the film-forming process of the process recipe. In the atmospheric pressure returning process, the inner atmosphere of the process chamber 201 after the film-forming process is replaced with an inert gas (substitution by inert gas), and the inner pressure of the process chamber 201 is returned to the atmospheric pressure (returning to atmospheric pressure). In the atmospheric pressure returning process, the cleaning gas is supplied to the components constituting the exhaust part 310 with the pre-set initial value such as the initial flow rate. A type of the cleaning gas species and the initial flow rate are appropriately determined depending on parameters such as types of by-products and an amount of the by-products estimated to adhere to the exhaust pipe 231 or the pump 244 in a film-forming step described later. When the abnormal tendency indicating the predetermined abnormality is less than the pre-set number of times (less than the pre-set value), or when the fluctuation of the average value of the apparatus data at the specific step is normal (that is, the non-fluctuation tendency), the main controller 25 sets a counter to zero. The counter is configured to count the abnormal tendency that the fluctuation of the average value of the apparatus data indicates the abnormality.

When the fluctuation of the average value is the abnormal tendency defined for each type of the apparatus data and the abnormal tendency reach the pre-set number of times continuously, that is, the abnormal tendency occurs more than the pre-set number of times (pre-set value), the main controller 25 changes the pre-set flow rate of the cleaning gas from an initial value such as the initial flow rate before the cleaning gas is supplied to the components constituting the exhaust part 310. That is, the main controller 25 determines that the exhaust pipe 231 and the exhaust device such as the pump 244 are starting to be clogged, and increases the amount of the cleaning gas. For example, the main controller 25 changes the amount of the cleaning gas by changing the flow rate of the cleaning gas and/or a supply time of the cleaning gas (that is, a time duration of supplying the cleaning gas). In addition, when the fluctuation of the average value is the abnormal tendency and the abnormal tendency reaches the pre-set number of times continuously, the main controller 25 generates an alarm and to notify a message indicating the alarm to the host apparatus or the display device 31. The main controller 25 also counts the number of times of the alarms generated. In addition, a cleaning process (that is, the cleaning recipe) described later may be performed after the process recipe is completed.

Then, the main controller 25 accumulates and counts the number of times of the alarms generated until a maintenance operation such as a replacing operation of replacing the components constituting the exhaust part 310 and an overhaul operation is performed. Then, the main controller 25 changes the pre-set flow rate of the cleaning gas in the cleaning step (that is, the exhaust cleaning process) in accordance with the number of times of the alarms generated. After the maintenance operation is performed, an alarm counter, which is an accumulated value of the number of times of the alarms generated, becomes 0 and is cleared.

As described above, the main controller 25 executes the cleaning step (that is, the exhaust cleaning process) during the atmospheric pressure returning process (or in parallel with the atmospheric pressure returning process). As described above, the atmospheric pressure returning process is performed after the film-forming process of the process recipe. In the atmospheric pressure returning process, the inner atmosphere of the process chamber 201 after the film-forming process is replaced with the inert gas (substitution by inert gas), and the inner pressure of the process chamber 201 is returned to the atmospheric pressure (returning to atmospheric pressure). In the atmospheric pressure returning process, the cleaning gas is supplied to the components constituting the exhaust part 310 with the pre-set initial value such as the initial flow rate. In addition, the main controller 25 fully closes the APC valve 242 and to start the exhaust cleaning process when the atmospheric pressure returning process and the exhaust cleaning process are performed in parallel.

When detecting the abnormality, the main controller 25 generates the alarm, changes the pre-set flow rate of the cleaning gas from the initial value in accordance with the number of times of the alarms generated, and performs the exhaust cleaning process in parallel with the atmospheric pressure returning process in accordance with the changed pre-set flow rate. When the counter indicating the accumulated value of the number of times of the alarms generated reaches the alarm limit number set in advance, the main controller 25 generates a second alarm and to notify a message indicating the second alarm to the host apparatus or the display device 31 so as to prohibit the execution of a process recipe to be performed (also referred to as a "next process recipe").

For example, the monitoring parameters such as the type of the apparatus data, the abnormal tendency defined in advance for each type of the apparatus data and the pre-set value (for example, the number of times) set in advance may be set independently for each type of the apparatus data by the operation device. Each parameter of the monitoring parameters described above may be set by the operation device of the main controller 25, or may be remotely set by an external computer.

The transfer controller 11 is configured to notify the controller 240 of the values detected by sensors (not shown) provided at each of the components constituting the transfer mechanism when the sensors detect a predetermined value or an abnormal value.

The temperature controller 12 is configured to adjust an inner temperature of the process furnace 202 by controlling a temperature of the heater 206 of the process furnace 202. The temperature controller 12 is also configured to notify the controller 240 of the value detected by the temperature sensor 263 when the temperature sensor 263 detects a predetermined value or an abnormal value.

The pressure controller 13 is configured to control the APC valve 242 based on the pressure detected by the pressure sensor 245 such that the inner pressure of the process chamber 201 is at a desired pressure at a desired timing. The pressure controller 13 is also configured to notify the controller 240 of the value detected by the pressure sensor 245 when the pressure sensor 245 detects a predetermined value or an abnormal value.

The gas supply controller 14 is configured to control the MFCs 241a through 241h such that the flow rate of the gas supplied into the process chamber 201 is at a desired flow rate at a desired timing. The gas supply controller 14 is also configured to control opening and closing of the valves 243a through 243h and the valves 245a through 245h.

The exhaust controller 15 is configured to control the pump 244 and the main pump (not shown) such that the inner atmosphere of the process chamber 201 is discharged (exhausted) to the outside of the process chamber 201. The exhaust controller 15 is also configured to monitor the electric current value, the rotation speed and the back pressure of the pump 244 detected by the pressure sensor 247, and to send the fluctuation thereof to the controller 240. The exhaust controller 15 is also configured to monitor an electric current value, a rotation speed and a back pressure of the main pump (not shown) in the same manners.

(4) Operation of Substrate Processing Apparatus

Hereinafter, operations of the components constituting the substrate processing apparatus 100 will be described with reference to FIGS. 1 through 3. The controller 240 is configured to control the operations of the components constituting the substrate processing apparatus 100.

As shown in FIGS. 1 and 2, after the pod 110 is placed on the loading port shelf 114, the pod 110 placed on the loading port shelf 114 is transferred (loaded) into the housing 111 through the pod loading/unloading port 112 by the pod transport device 118.

The pod 110 loaded into the housing 111 is automatically transferred to and temporarily stored in a shelf plate of the rotatable pod shelf 105 by the pod transport device 118. Thereafter, the pod 110 is transferred to the placement table 122 of one of the upper pod opener 121 and the lower pod opener 121 from the shelf plate of the rotatable pod shelf 105.

By detaching the cap of the pod 110 by the cap attaching/detaching mechanism 123, and the wafer entrance of the pod 110 is opened. Thereafter, the wafer 200 is transported out of the pod 110 by tweezers of the wafer transport device 125a via the wafer entrance, and is aligned by a notch alignment device (not shown). The wafer 200 is then charged (transferred) into the boat 217. After charging the wafer 200 into the boat 217, the wafer transport device 125a then returns to the pod 110 and transports a next wafer among the wafers from the pod 110 into the boat 217.

While the wafer transport mechanism 125 loads the wafers including the wafer 200 from the one of the upper pod opener 121 and the lower pod opener 121 into the boat 217, another pod 110 is transferred to and placed on the placement table 122 of the other one of the upper pod opener 121 and the lower pod opener 121 from the rotatable pod shelf 105 by the pod transport device 118, and the cap of the another pod 110 is opened by the other one of the upper pod opener 121 and the lower pod opener 121.

After a predetermined number of the wafers including the wafer 200 are charged into the boat 217, the substrate processing (film-forming process) described later is performed. After the film-forming process is completed, the processed wafers including the wafer 200 are discharged (transferred) out of the boat 217 and stored in the pod 110.

After the processed wafers are discharged, the pod 110 accommodating the processed wafers including the wafer 200 is transferred out of the housing 111 in an order reverse to that described above except for an aligning process of the wafers by the notch alignment device (not shown).

(5) Substrate Processing

Hereinafter, the substrate processing will be described in detail. When performing the substrate processing, the main controller 25 executes the process recipe stored in the program storage region 33 of the memory device 28.

Hereinafter, an example in which a silicon nitride film (hereinafter, also referred to as an "SiN film") is formed on the wafer 200 by using hexachlorodisilane ($Si_2Cl_6$, abbreviated as HCDS) gas as a source gas (that is, the process gas) and ammonia ($NH_3$) gas as a reactive gas will be described. In the following descriptions, the operations of the components constituting the substrate processing apparatus 100 are controlled by the controller 240.

According to the example of the substrate processing, the SiN film is formed on the wafer 200 by performing a cycle a predetermined number of times (at least once). For example, the cycle may include: a step of supplying the HCDS gas to the wafer 200 in the process chamber 201; a step of removing the HCDS gas (residual gas) from the process chamber 201; a step of supplying the $NH_3$ gas to the wafer 200 in the process chamber 201; and a step of removing the $NH_3$ gas (residual gas) from the process chamber 201. The steps of the cycle are non-simultaneously performed.

In the present specification, the term "substrate" and "wafer" may be used as substantially the same meaning. That is, the term "substrate" may be substituted by "wafer" and vice versa.

<Wafer Charging and Boat Loading Step>

After the wafers including the wafer 200 are charged (transferred) into the boat 217 (wafer charging step), the boat 217 charged with the wafers is elevated by the boat elevator 115 and loaded (transferred) into the process chamber 201 (boat loading step). With the boat 217 loaded, the lid 219 seals (closes) the lower end of the manifold 209 via the O-ring 220b.

<Preparation Step>

The pump 244 and the main pump (not shown) vacuum-exhaust the inner atmosphere of the process chamber 201 until the inner pressure of the process chamber 201 reaches a desired pressure from the atmospheric pressure. In the preparation step, the inner pressure of the process chamber 201 is measured by the pressure sensor 245, and the APC valve 242 is feedback-controlled based on the measured pressure. The back pressure of the pump 244 is measured by the pressure sensor 247. The pump 244 and the main pump (not shown) continuously vacuum-exhaust the inner atmosphere of the process chamber 201 until at least the processing of the wafer 200 is completed.

The heater 206 heats the process chamber 201 until a temperature of the wafer 200 in the process chamber 201 reaches a desired temperature. When the heater 206 heats the process chamber 201, the state of the electric conduction to the heater 206 is feedback-controlled based on the temperature detected by the temperature sensor 263 such that the inner temperature of the process chamber 201 has a desired temperature distribution. The heater 206 continuously heats the process chamber 201 until at least the processing of the wafer 200 is completed.

Then, the rotating mechanism 254 rotates the boat 217 and the wafers including the wafer 200. That is, by rotating the boat 217 by the rotating mechanism 254, the wafers including the wafer 200 are rotated. The rotating mechanism 254 continuously rotates the boat 217 and the wafers until at least the processing of the wafer 200 is completed.

<First Purge Step>

Then, with the valves 245c, 243c, 245d, 243d, 245g and 243g open, $N_2$ gas is supplied into the process chamber 201 through the nozzles 230a, 230b and 230c, and is exhausted through the exhaust part 310. The $N_2$ gas serves as a purge gas. As a result, the inner atmosphere of the process chamber 201 is purged.

<Film-Forming Step>

When the inner temperature of the process chamber 201 is stabilized at a predetermined process temperature, the film-forming step is performed by sequentially performing the following two steps, that is, a first step and a second step.

<First Step>

In the first step, the HCDS gas is supplied to the wafer 200 in the process chamber 201.

By opening of the valves 245a and 243a, the HCDS gas is supplied into the gas supply pipe 232a. A flow rate of the HCDS gas is adjusted by the MFC 241a. The HCDS gas with the flow rate thereof adjusted is supplied into the process chamber 201 through the nozzle 230a, and is exhausted through the exhaust part 310. Thereby, the HCDS gas is supplied to the wafer 200 in the process chamber 201. Simultaneously, by opening of the valves 245c and 243c, the $N_2$ gas is supplied. A flow rate of the $N_2$ gas is adjusted by the MFC 241c. The $N_2$ gas with the flow rate thereof adjusted is supplied to the wafer 200 in the process chamber 201 through the nozzle 230a together with the HCDS gas, and is exhausted through the exhaust pipe 231. By supplying the HCDS gas to the wafer 200 in the process chamber 201, a silicon-containing layer having a thickness of, for example, several atomic layers is formed as a first layer on an outermost surface of the wafer 200.

After the first layer is formed, the valves 245a and 243a are closed to stop the supply of the HCDS gas into the process chamber 201. By maintaining the APC valve 242 open, the pump 244 and the main pump (not shown) vacuum-exhaust the inner atmosphere of the process chamber 201 to remove the HCDS gas remaining in the process chamber 201 which did not react or which contributed to the formation of the first layer from the process chamber 201. In addition, by maintaining the valves 245c and 243c open, the $N_2$ gas is continuously supplied into the process chamber 201. The $N_2$ gas serves as a purge gas, which improves the efficiency of removing the residual gas such as the HCDS gas remaining in the process chamber 201 from the process chamber 201.

<Second Step>

After the first step is completed, the $NH_3$ gas is supplied to the wafer 200 in the process chamber 201, more specifically, supplied to the first layer formed on the wafer 200. In the second step, the $NH_3$ gas is thermally activated and then supplied to the wafer 200.

In the second step, the valves 245b, 243b, 245d and 243d are controlled in the same manners as the valves 245a, 243a, 245c and 243c are controlled in the first step. A flow rate of the $NH_3$ gas is adjusted by the MFC 241b. Then, the $NH_3$ gas with the flow rate thereof adjusted is supplied into the process chamber 201 through the nozzle 230b, and is exhausted through the exhaust pipe 231. Thereby, the $NH_3$ gas is supplied to the wafer 200 in the process chamber 201. The $NH_3$ gas supplied to the wafer 200 reacts with at least a portion of the first layer (that is, the silicon-containing layer) formed on the wafer 200 in the first step. As a result, the first layer is thermally nitrided by non-plasma, and is modified (changed) into a second layer, that is, a silicon nitride layer (also referred to as an "SiN layer").

After the second layer is formed, the valves 245b and 243b are closed to stop the supply of the $NH_3$ gas into the process chamber 201. The $NH_3$ gas remaining in the process chamber 201 which did not react or which contributed to the formation of the second layer and reaction by-products remaining in the process chamber 201 are exhausted from the process chamber 201 in the same manners as in the first step. Similar to the first step, it is not necessary to completely remove the residual gas such as the $NH_3$ gas remaining in the process chamber 201 or the reaction by-products remaining in the process chamber 201.

<Performing a Predetermined Number of Times>

By performing the cycle wherein the first step and the second step are performed non-simultaneously a predetermined number of times (n times), the SiN film of a predetermined thickness is formed on the wafer 200. That is, the cycle is performed (repeated) until a total thickness of the SiN film formed by stacking the second layer (that is, the SiN layer) by performing the cycle a plurality of times reaches the predetermined thickness under the conditions that the second layer formed in each cycle is thinner than the predetermined thickness.

<Second Purge Step>

After the film-forming step is completed, with the valves 245c, 243c, 245d, 243d, 245g and 243g open, the $N_2$ gas is supplied into the process chamber 201 through the nozzles 230a, 230b and 230c, and is exhausted through the exhaust pipe 231. The $N_2$ gas serves as the purge gas. The inner atmosphere of the process chamber 201 is purged with the $N_2$ gas, thus the gas remaining in the process chamber 201 or the reaction by-products remaining in the process chamber 201 are removed from the process chamber 201 (purging). Thereafter, the atmospheric pressure returning process is performed. That is, the inner atmosphere of the process chamber 201 is replaced with the inert gas (substitution by inert gas), and the inner pressure of the process chamber 201 is returned to the atmospheric pressure (returning to atmospheric pressure). The cleaning step such as the exhaust cleaning process described above is performed in parallel with the atmospheric pressure returning process. The cleaning step such as the exhaust cleaning process will be described in detail later.
<Boat Unloading and Wafer Discharging Step>

Thereafter, the lid 219 is lowered by the boat elevator 115 and a lower end of the process tube 203 is opened. The boat 217 with the processed wafers including the wafer 200 charged therein is transferred (unloaded) out of the process tube 203 (boat unloading step). After the boat 217 is unloaded out of the process tube 203, the processed wafers including the wafer 200 are transferred (discharged) out of the boat 217 (wafer discharging step).

(6) Process Chamber Cleaning Process

A cleaning step (also referred to as a "process chamber cleaning process") is performed when removing the by-products adhered to the components constituting the process chamber 201. When performing the process chamber cleaning process, the main controller 25 executes the cleaning recipe stored in the program storage region 33 of the memory device 28.

A method of cleaning the process chamber 201 using the cleaning gas in the process chamber cleaning process according to the embodiments will be described. A fluorine-containing gas such as fluorine ($F_2$) gas and hydrogen fluoride (HF) gas may be used as the cleaning gas. That is, a halogen gas (also referred to as a "halogen-containing gas") may be used as the cleaning gas.

Specifically, with loading the boat 217 without accommodating the wafers (hereinafter, also referred to as an "empty boat 217") into the process chamber 201 or without loading the boat 217 into the process chamber 201, the lower end of the process furnace 202 is closed by a furnace opening shutter (not shown). Then, the APC valve 242 vacuum-exhausts the process chamber 201 such that the inner pressure of the process chamber 201 reaches a predetermined cleaning pressure. The heater 206 heats the process chamber 201 such that the inner temperature of the process chamber 201 reaches a predetermined cleaning temperature.

Then, while the inner temperature and the inner pressure of the process chamber 201 are maintained at the predetermined cleaning temperature and the predetermined cleaning pressure, the cleaning gas is supplied into the process chamber 201.

Specifically, the valves 243a through 243d, 243g, 243h, 245a through 245d, 245g and 245h are closed to stop the supplies of the process gas, the reactive gas and the inert gas into the process chamber 201, and the valves 243e and 245e is opened to supply the cleaning gas to the gas supply pipe 232e. A flow rate of the cleaning gas is adjusted by the MFC 241e. The cleaning gas with the flow rate thereof adjusted is supplied into the process chamber 201 through the nozzle 230c, and is exhausted through the exhaust part 310. When the cleaning gas is supplied, the valves 245f and 243f are closed. Simultaneously, the valves 245c, 243c, 245d and 243d may be opened to supply the $N_2$ gas into the gas supply pipes 232a and 232b. The flow rate of the $N_2$ gas is adjusted by the MFCs 241c and 241d. The $N_2$ gas with the flow rate thereof adjusted is supplied into the process chamber 201 together with the cleaning gas, and is exhausted through the exhaust pipe 231.

That is, the cleaning gas supplied into the process chamber 201 flows upward in the process chamber 201, flows out through an upper end opening of the inner tube 204 into the cylindrical space 250, flows down the cylindrical space 250, and then is exhausted through the exhaust part 310. When the cleaning gas passes through the process chamber 201, the cleaning gas comes into contact with the by-products adhered to the process chamber 201 so that the by-products are etched and removed. After a predetermined process time has elapsed and the by-products are completely removed, the valves 245e and 243e are closed to stop the supply of the cleaning gas into the process chamber 201.

(7) Exhaust Cleaning Process

Figures 5, 6:
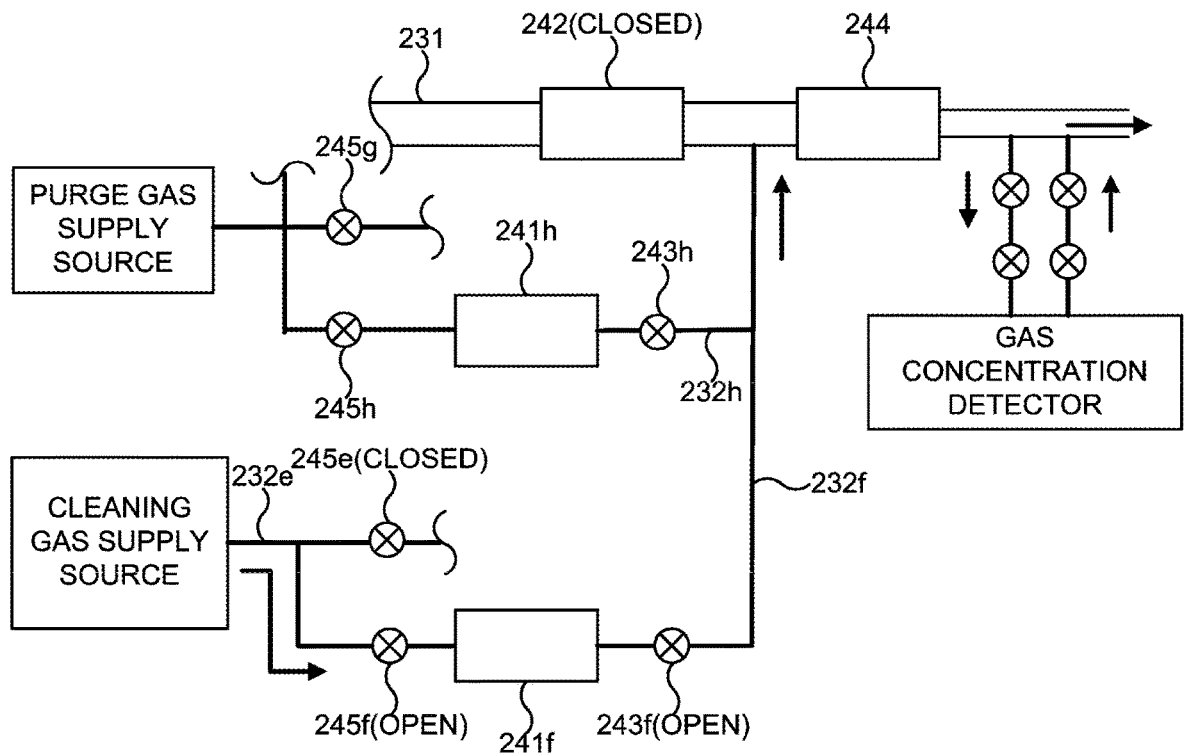
FIG. 5 schematically illustrates an exhaust system of the substrate processing apparatus preferably used in the embodiments described herein.
FIG. 6 schematically illustrates an exhaust cleaning process according to the embodiments described herein.

After the film-forming process of the process recipe is performed, the atmospheric pressure returning process is performed. That is, the inner atmosphere of the process chamber 201 is replaced with the inert gas (substitution by inert gas), and the inner pressure of the process chamber 201 is returned to the atmospheric pressure (returning to atmospheric pressure) as shown in FIG. 6 described later. During performing the atmospheric pressure returning process, the exhaust cleaning process described above is performed. In the exhaust cleaning process according to the embodiments, the cleaning gas is supplied to the components constituting the exhaust part 310 with the pre-set initial value. That is, as shown in FIG. 6 described later, since the exhaust cleaning process is incorporated in the process recipe, it is possible to perform the atmospheric pressure returning process in the process recipe in parallel with the exhaust cleaning process. As a result, it is possible to supply the cleaning gas of a pre-set amount (that is, the initial flow rate) to the components constituting the exhaust part 310 whenever the process recipe is performed. Therefore, it is possible to remove the by-products in the exhaust part 310. In addition, when the abnormal tendency is detected in the components constituting the exhaust part 310 while performing the process recipe, it is possible to change the pre-set flow rate of the cleaning gas from the initial value (that is, the initial flow rate), and to supply the cleaning gas with the flow rate thereof changed to the components constituting the exhaust part 310.

When the controller 240 according to the embodiments detects the abnormal tendency such as the pipe such as the exhaust pipe 231 is blocked (clogged) and the pump such as the pump 244 is stopped due to the adhesion of the by-products to the components of the exhaust part 310, the controller 240 generates the alarm and changes (that is, increase) the pre-set flow rate of the cleaning gas. In addition, by setting an appropriate amount of the cleaning gas in accordance with the number of times of the alarms generated, it is possible to extend a maintenance cycle of the components constituting the exhaust part 310, and to improve an operation rate of an apparatus such as the substrate processing apparatus 100. In addition, it is possible to remove the by-products before the by-products are deposited to the components such as the exhaust pipe 231, the pump 244 and the main pump (not shown) constituting the exhaust part 310 while suppressing a total amount of the cleaning gas in the exhaust cleaning process, as compared with a case in which the exhaust cleaning process is performed using the cleaning gas with a constant amount.

Specifically, the main controller 25 acquires the apparatus data indicating the state of the exhaust part 310 at the predetermined specific step while performing the process recipe, and generates the alarm and to notify the message indicating the alarm to the host apparatus or the display device 31 when the abnormality tendency (hereinafter, also referred to as a "sign") in the exhaust part 310 is detected, for example, from the data such as the electric current value, the rotation speed and the back pressure of the pump 244. Then, whenever the number of the alarms generated is increased, the main controller 25 increases the pre-set flow rate of the cleaning gas. That is, the main controller 25 changes the pre-set flow rate of the cleaning gas in accordance with the number of the times the alarms generated, and to automatically perform the cleaning step (that is, the exhaust cleaning process) with the changed pre-set flow rate of the cleaning gas in parallel with the atmospheric pressure returning process of the process recipe.

Figure 4:
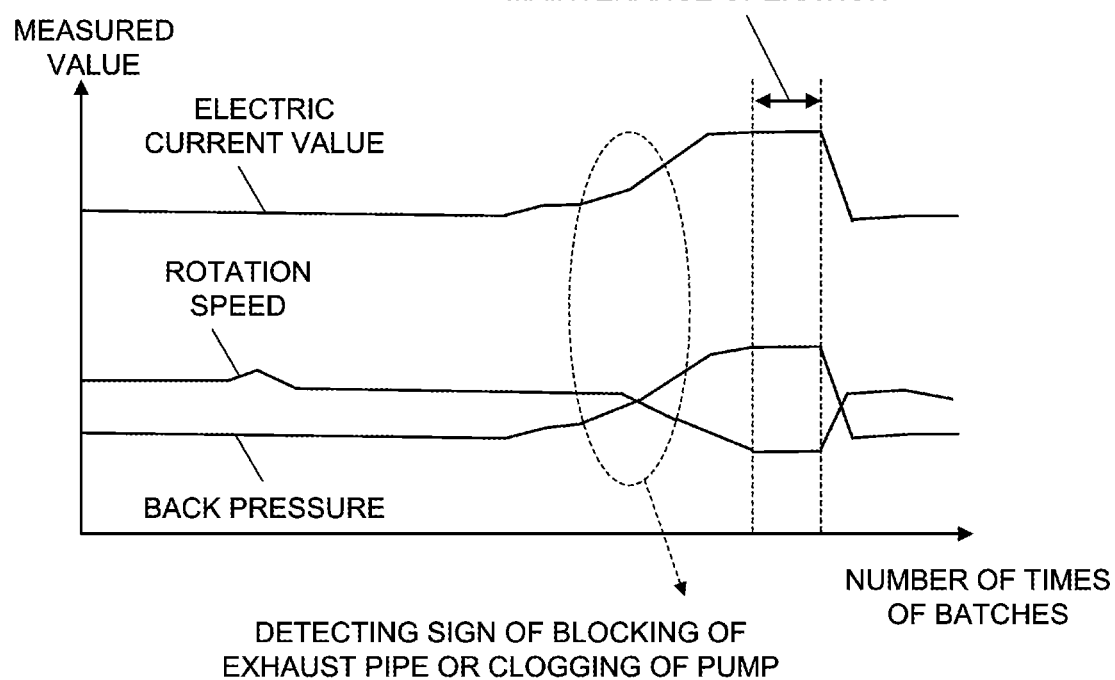
FIG. 4 schematically illustrates an electric current value, a rotation speed and a back pressure of an auxiliary pump while performing a process recipe according to the embodiments described herein.

For example, the main controller 25 executes the exhaust cleaning process with the initial flow rate of the cleaning gas in parallel with the atmospheric pressure returning process after performing the film-forming process. Then, as shown in FIG. 4, the main controller 25 acquires the apparatus data from the group consisting of the electric current value, the rotation speed and the back pressure of the pump 244 while performing the process recipe, and executes the exhaust cleaning process by increasing the flow rate of the cleaning gas such that the apparatus does not stop due to the clogging of the pump 244 and the closing (or blocking) of the exhaust pipe 231 when the abnormal tendency such as the clogging of the pump 244 and the closing of an end portion of the exhaust pipe 231 is detected. The apparatus data from the group consisting of the electric current value, the rotation speed and the back pressure of the pump 244 may be preferably acquired at a step (for example, the preparation step) in which a load is applied to the pump 244.

Hereinafter, the exhaust cleaning process according to the embodiments will be described with reference to FIG. 2. When the film-forming step in the process recipe described above is completed and the second purge step is completed, the atmospheric pressure returning process is performed. When performing the atmospheric pressure returning process, the main controller 25 opens the valves 245c, 243c, 245d, 243d, 245g and 243g to supply the $N_2$ gas to the process chamber 201 through the nozzles 230a, 230b and 230c. The $N_2$ gas may be supplied to the process chamber 201 through only one of the nozzles 230a, 230b and 230c. When the $N_2$ gas is supplied, the APC valve 242 is fully closed. While the process chamber 201 is maintained at an $N_2$ gas atmosphere, the $N_2$ gas is supplied until the inner atmosphere of the process chamber 201 is gradually increased from the process pressure (a predetermined decompressed pressure) to the atmospheric pressure. The atmospheric pressure returning process may be performed about several minutes, for example, 5 minutes.

Then, in parallel with the atmospheric pressure returning process described above, the main controller 25 closes the valves 245a, 243a, 245b, 243b, 245e, 243e, 245h and 243h to stop the supplies of the process gas, the reactive gas and the cleaning gas to the process chamber 201 and the supply of the inert gas to the exhaust part 310. The main controller 25 opens the valves 245f and 243f to supply the cleaning gas to the gas supply pipe 232f. The flow rate of the cleaning gas is adjusted to, for example, the pre-set flow rate (initial flow rate) by the MFC 241f. The cleaning gas with the flow rate thereof adjusted is supplied to the exhaust part 310 while controlling the cleaning gas to bypass the process chamber 201. The operations of the valves described above do not change even when the abnormality is detected due to the change in the average value of the apparatus data. However, the flow rate adjusted by the MFC 241f may be different. Alternatively, the supply time (time duration) of the cleaning gas may be changed without changing the flow rate of the cleaning gas adjusted by the MFC 241f.

That is, as shown in FIG. 2, the cleaning gas is exhausted to the outside of the housing 111 through the gas supply pipe 232f, the exhaust pipe 231, the pump 244, the pressure sensor 247 and the main pump (not shown). That is, when the cleaning gas passes through the exhaust part 310, the cleaning gas comes into contact with the by-products adhered to the exhaust part 310 so that the by-products are etched and removed. After a predetermined process time has elapsed and the by-products are completely removed, the valves 245f and 243f are closed to stop the supply of the cleaning gas into the exhaust part 310. The process time described above is set to a time that the exhaust cleaning process is always completed during the atmospheric pressure returning process. That is, a total time of the exhaust cleaning process is configured to be shorter than a total time of the atmospheric pressure returning process. In addition, a start time of the atmospheric pressure returning process is set earlier than a start time of the exhaust cleaning process, and an end time of the atmospheric pressure returning process is set later than an end time of the exhaust cleaning process.

The exhaust cleaning process according to the embodiments will be specifically described with reference to FIGS. 5 through 7.

FIG. 5 schematically illustrates the exhaust system (also referred to as an "exhaust line") shown in FIG. 2. As shown in FIG. 5. the cleaning gas (for example, the fluorine-containing gas such as the $F_2$ gas and the HF gas) can be supplied from the cleaning gas supply source to the exhaust pipe 231 between an exhaust side of the APC valve 242 and a supply side of the pump 244 directly through a bypass line while controlling the cleaning gas to bypass the process chamber 201 with the APC valve 242 closed. A gas concentration detector such as a Fourier Transform Infrared Spectroscopy (FT-IR) detector is provided at the exhaust pipe 231 on an exhaust side of the pump 244. The gas concentration detector is configured to detect a gas concentration in the exhaust pipe 231 at least when the cleaning gas is being supplied.

FIG. 6 schematically illustrates an example in which the exhaust cleaning process is incorporated in the atmospheric pressure returning process of the process recipe. It goes without saying that the exhaust cleaning process according to the embodiments may be incorporated into the process recipe in a manner other than the example shown in FIG. 6.

As shown in FIG. 6, the supply of the cleaning gas from the start to the end is completed while performing the atmospheric pressure returning process. With such a configuration, it is possible to perform the exhaust cleaning process whenever the process recipe is performed.

The exhaust cleaning process will be described below with reference to FIGS. 5 and 6. In FIG. 6, the atmospheric pressure returning process is divided into a first atmospheric pressure returning step (indicate by "FIRST APRS" in FIG. 6), a second atmospheric pressure returning step (indicate by "SECOND APRS" in FIG. 6), a third atmospheric pressure returning step (indicate by "THIRD APRS" in FIG. 6) and a fourth atmospheric pressure returning step (indicate by "FOURTH APRS" in FIG. 6). However, the atmospheric pressure returning process is divided into the first atmospheric pressure returning step through the fourth atmospheric pressure returning step in order to facilitate the description of the exhaust cleaning process.

First, when the atmospheric pressure returning process is started, the APC valve 242 is closed (fully closed) and the valve 245e is closed. According to the embodiments, the APC valve 242 and the valve 245e are closed until the atmospheric pressure returning process and the next boat unloading step are completed. Almost simultaneously, the valve 243f is opened, and the gas supply pipe 232f and the exhaust pipe 231 on the exhaust side of the APC valve 242 are depressurized by the pump 244 (first atmospheric pressure returning step). That is, the first atmospheric pressure returning step is a step of decompressing and exhausting the gas supply pipe 232f and the exhaust pipe 231 as a preparation of supplying the cleaning gas. According to the embodiments, for example, the first atmospheric pressure returning step is performed for 1 minute as shown in FIG. 6. In the first atmospheric pressure returning step, the valves 245h and 243h may be opened to supply the inert gas serving as the purge gas from the purge gas supply source to the gas supply pipe 232f and the exhaust pipe 231. In the present specification, the term "almost simultaneously" refers to not only the same time but also a time of less than 1 second difference. When "almost simultaneously" refers to the time of less than 1 second difference, since the pump 244 is constantly operated, it means that the opening of the valve 243f is slightly delayed. It is needless to say that the valve 245f is in a closed state when the atmospheric pressure returning process is started.

Subsequently, while the APC valve 242 is maintained closed, the valves 245f and 243f are opened, the cleaning gas with the flow rate thereof adjusted by the MFC 241 is supplied to the gas supply pipe 232f and the exhaust pipe 231 on the exhaust side of the APC valve 242 while the pressure is decompressed by the pump 244 (second atmospheric pressure returning step). That is, the second atmospheric pressure returning step is a supply step of supplying the cleaning gas to the gas supply pipe 232f and the exhaust pipe 231 on the exhaust side of the APC valve 242 as shown in FIG. 5. For example, the second atmospheric pressure returning step is performed for 10 minutes as shown in FIG. 6. There will be no problem when the entire time duration of the exhaust cleaning process is shorter than that of the atmospheric pressure returning process. Therefore, it is needless to say that the time duration of the second atmospheric pressure returning step is not limited to 10 minutes. That is, the time duration of 10 minutes is only an exemplary time duration of the second atmospheric pressure returning step. In the second atmospheric pressure returning step, the valves 245h and 243h may be opened to supply the purge gas from the purge gas supply source to the gas supply pipe 232f and the exhaust pipe 231.

While the cleaning gas is supplied in the second atmospheric pressure returning step, the concentration of the gas such as the cleaning gas in the exhaust pipe 231 is detected by the gas concentration detector provided on the exhaust side of the pump 244. The gas to be detected is set in advance according to a type of the cleaning gas.

Subsequently, while the APC valve 242 is maintained closed, the valve 245f is closed and 243f is opened, and the cleaning gas in the gas supply pipe 232f and the exhaust pipe 231 on the exhaust side of the APC valve 242 is exhausted while the pressure is decompressed by the pump 244 (third atmospheric pressure returning step). That is, the third atmospheric pressure returning step is a step of exhausting the gas supply pipe 232f and the exhaust pipe 231 under the decompressed pressure in order to remove materials such as residues of the supplied cleaning gas and the unreacted gas. For example, the third atmospheric pressure returning step is performed for 2 minutes and 10 seconds as shown in FIG. 6. In the third atmospheric pressure returning step, the valves 245h and 243h may be opened to supply the purge gas from the purge gas supply source to the gas supply pipe 232f and the exhaust pipe 231.

Subsequently, while the APC valve 242 is maintained closed, the gas supply pipe 232f and the exhaust pipe 231 on the exhaust side of the APC valve 242 are purged by the inert gas. Subsequently, while the valve 245f is closed, the valves 245h and 243h are opened to supply the purge gas from the purge gas supply source to the gas supply pipe 232f and the exhaust pipe 231, and while the APC valve 242 is maintained closed and the valve 245f is opened, the gas supply pipe 232f and the exhaust pipe 231 on the exhaust side of the APC valve 242 are exhausted by the pump 244 (fourth atmospheric pressure returning step). That is, the fourth atmospheric pressure returning step is a purging step of supplying the purge gas to the gas supply pipe 232f and the exhaust pipe 231 and purging each of the gas supply pipe 232f, the exhaust pipe 231 and the pump 244. For example, the fourth atmospheric pressure returning step is performed for 1 minutes and 30 seconds as shown in FIG. 6. The purge gas is not particularly limited as long as it is the inert gas.

The exhaust cleaning process is completed when the purging step described above (that is, the fourth atmospheric pressure returning step) is completed and the valves 245f, 243f, 245h and 243h are all closed. In FIG. 6, the exhaust cleaning process and the atmospheric pressure returning process are completed almost at the same time. However, the atmospheric pressure returning process is always completed after the exhaust cleaning process is completed.

Although the time duration of each of the first atmospheric pressure step through the fourth atmospheric pressure step is set for each step, it is preferable that each of the first atmospheric pressure step through the fourth atmospheric pressure step is completed before the time duration thereof set in advance for each step.

Since the APC valve 242 and the valve 245e are fully closed, the atmospheric pressure returning process is performed completely independently of the exhaust cleaning process described above. The atmospheric pressure returning process of replacing the inner atmosphere of the process chamber 201 with the inert gas and returning the inner pressure of the process chamber 201 to the atmospheric pressure is performed in parallel with and independently of the exhaust cleaning process. For example, even when the atmospheric pressure is reached during performing the second atmospheric pressure returning step, by stopping the supply of the inert gas or by finely adjusting the inner pressure of the process chamber 201 so that the process chamber 201 is not overpressurized by operating a pressure adjusting device (not shown) to exhaust the inner atmosphere of the process chamber 201, for example, even when the APC valve 242 is fully closed, there is no particular problem in performing the atmospheric pressure returning process in parallel with and independently of the exhaust cleaning process.

Figure 7:
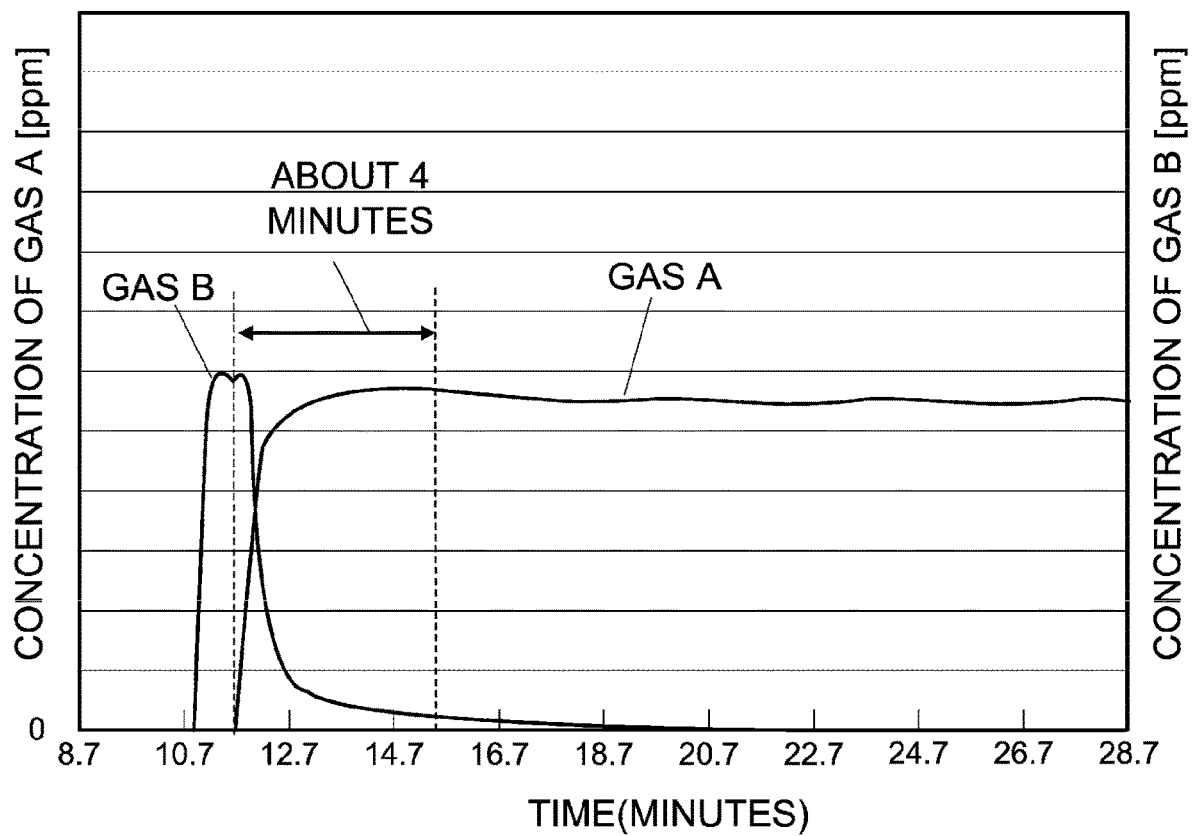
FIG. 7 schematically illustrates exemplary experimental results of the exhaust cleaning process shown in FIG. 6.

FIG. 7 schematically illustrates exemplary experimental results obtained by performing the exhaust cleaning process shown in FIG. 6 when the accumulated thickness of the film is 6 nm. The exemplary experimental results are obtained by performing the exhaust cleaning process when the HF gas (indicated by "GAS A" in FIG. 7) is used as the cleaning gas and 2 liter of the HF gas is supplied for 10 minutes. As shown in FIG. 7, a concentration of $SiF_4$ gas (indicated by "GAS B" in FIG. 7) serving as the by-products is decreased to near 0 ppm in about 4 minutes. That is, by detecting the concentration of the $SiF_4$ gas by the gas concentration detector, it is confirmed the by-products were removed in about 4 minutes. As described above, by incorporating the exhaust cleaning process in the process recipe and by supplying the cleaning gas to the exhaust pipe 231 and the pump 244 under the conditions described above whenever the process recipe is performed, it is possible to improve the maintenance cycle of the pump 244 by 2 times or more.

According to the exemplary experimental results described above, although the cleaning gas is supplied to the exhaust pipe 231 and the pump 244 without the by-products remained for about 6 minutes, it is possible to improve the maintenance cycle of the pump 244 by 2 times or more. However, by changing the conditions (also referred to as "cleaning conditions"), it is possible to further improve the maintenance cycle of the pump 244. For example, in the exemplary experimental results described above, it is possible to further improve the maintenance cycle of the pump 244 by reducing the flow rate of the cleaning gas from 2 liter to 1 liter or by shortening the time duration of supplying the cleaning gas from 10 minutes to 5 minutes. As described above, by changing the cleaning conditions, it is possible to expect further effects.

Hereinafter, an operation of performing the exhaust cleaning process by the controller 240 will be described with reference to FIGS. 8 through 10. The main controller 25 executes the exhaust cleaning process in parallel with the atmospheric pressure returning process shown in FIG. 10. The cleaning gas is supplied in the exhaust cleaning process and the inert gas is supplied in the purging step, and the back pressure of the pump 244 is almost exhausted by the main pump (not shown). Thus, as shown on FIG. 10, the pressure in the exhaust cleaning process is substantially the same as the pressure in the purging step.

When performing the process recipe, the back pressure of the pump 244 sharply rises and a load is applied to the pump 244 in the preparation step of vacuum-exhausting the inner atmosphere of the process chamber 201 from the atmospheric pressure. Hereinafter, an example in which the p preparation step is performed as the specific step described above.

Figure 8:
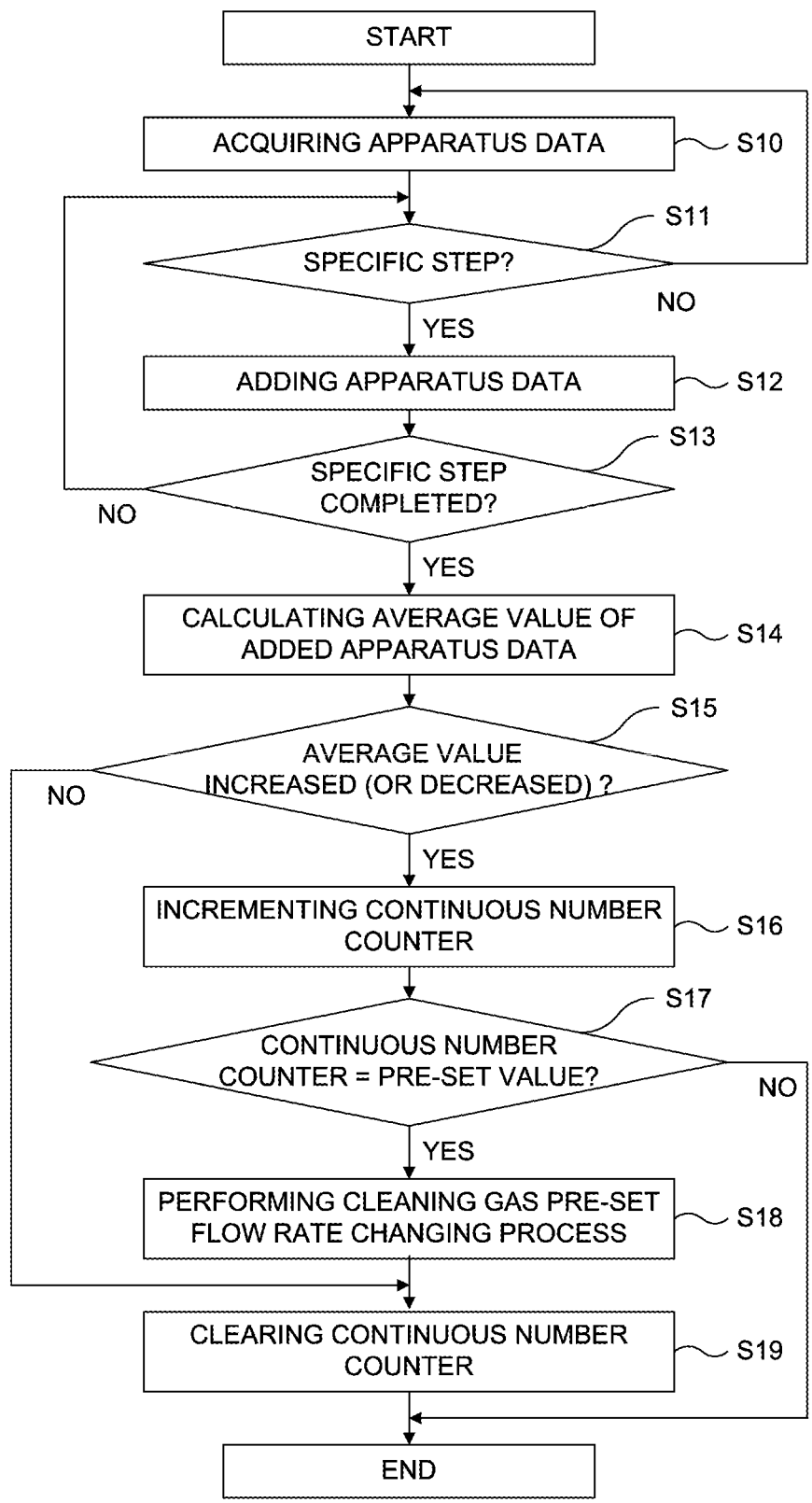
FIG. 8 schematically illustrates a control flow while performing the process recipe used in the substrate processing apparatus.

As shown in FIG. 8, the main controller 25 acquires the apparatus data while performing the process recipe from the start of the process recipe (step S10). Specifically, as the apparatus data, the data indicating the electric current value, the rotation speed and the back pressure of the pump 244 while performing the process recipe is acquired at least at a predetermined interval.

Then, for example, by the main controller 25, it is determined whether or not the predetermined specific step of the recipe (that is, the process recipe) is being performed (step S11). Specifically, it is determined whether or not it is the preparation step (also referred to as a "slow pump step") shown in FIG. 10 is being performed.

When it is determined that the predetermined specific step is not being performed ("NO" in step S11), the step S10 is performed again. When it is determined that the predetermined specific step is being performed ("YES" in step S11), the apparatus data acquired at the predetermined interval in the specific step is added (step S12). Alternatively, only the apparatus data in the specific step may be acquired.

Then, it is determined whether or not the specific step is completed (step S13). When it is determined that the specific step is not completed ("NO" in step S13), the step S11 is performed again.

When it is determined that the specific step is completed ("YES" in step S13), the main controller 25 calculates the average value of the added apparatus data and stores the average value in the memory device 28 (step S14). Specifically, the electric current value, the rotation speed and the back pressure of the pump 244 during the preparation step are acquired, for example, in a cycle of 1 second, and added. Then, the average value is calculated by dividing the accumulative value of the added data by the number of additions, and stored in the memory device 28.

Then, the main controller 25 compares the average value of the data calculated in the step S14 of the currently performed process recipe with the average value of the data calculated in the same manner for the previously performed process recipe (step S15). Specifically, for example, the average values of the electric current value, the rotation speed and the back pressure of the pump 244 of the preparation step of the currently performed process recipe and the average values of the electric current value, the rotation speed and the back pressure of the pump 244 of the preparation step of the previously performed process recipe are compared with each other, respectively.

Then, the main controller 25 checks the monitoring parameters stored in the memory device 28. When it is determined, for example, by the main controller 25, that the average value of the currently performed process recipe has not increased (or decreased) from the average value of the previously performed process recipe (that is, there is no abnormal tendency) ("NO" in step S15), the main controller 25 clears a continuous number counter configured to count the number of the abnormal tendency continuously occurs to zero (step S19), and the steps shown in FIG. 8 are completed. Specifically, for example, the main controller 25 determines that the average value of the electric current value the pump 244 of the preparation step of the currently performed process recipe has not increased from the average value of the electric current value the pump 244 of the preparation step of the previously performed process recipe. Then, when it is determined that the average value of the electric current value the pump 244 of the preparation step of the currently performed process recipe has not increased, the main controller 25 clears the continuous number counter to zero. In addition, the average value of the rotation speed of the pump 244 and the average value of the back pressure of the pump 244 are also compared in the same manners.

When it is determined, for example, by the main controller 25, that the average value of the currently performed process recipe has increased (or decreased) from the average value of the previously performed process recipe (that is, there is the abnormal tendency) ("YES" in step S15), the main controller 25 starts counting (counter increment) of the continuous number counter (step S16). That is, the continuous number counter is incremented. Then, it is determined, for example, by the main controller 25, whether or not the number of the continuous number counter indicating that the average value of the currently performed process recipe has increased (or decreased) continuously is equal to or more than the pre-set value (that is, the number of times) (step S17).

When it is determined, for example, by the main controller 25, that the average value of the currently performed process recipe has not increased (or decreased) continuously equal to or more than the pre-set value (that is, the number of times) (that is, there is no abnormal tendency) ("NO" in step S17), the steps shown in FIG. 8 are completed. When it is determined that the average value of the currently performed process recipe has increased (or decreased) continuously equal to or more than the pre-set value (that is, there is the abnormal tendency) ("YES" in step S17), the main controller 25 executes a cleaning gas pre-set flow rate changing process described later (step S18). Then, the main controller 25 clears the continuous number counter (step S19), and the steps shown in FIG. 8 are completed.

Specifically, for example, when it is determined that the average value of the electric current value the pump 244 of the preparation step of the currently performed process recipe has increased from the average value of the electric current value the pump 244 of the preparation step of the previously performed process recipe, the main controller 25 starts counting (counter increment) of the continuous number counter. When the electric current value of the pump 244 tends to increase continuously a predetermined number of times, which is the pre-set value of the monitoring parameters (for example, 5 times continuously), the main controller 25 generates the alarm and changes the pre-set flow rate of the cleaning gas in the exhaust cleaning process. For example, when the average value of the electric current value of the pump 244 has increased continuously during the preparation step, for example, 14.421 A (Ampere) for a $47^{th}$ batch, 14.528 A for a $48^{th}$ batch, 14.596 A for a $49^{th}$ batch, 14.660 A for a $50^{th}$ batch, and 15.063 A for a $51^{st}$ batch when the rotation speed of the pump 244 is 6.879 krpm and the back pressure of the pump 244 is 1.000 kPa, the main controller 25 generates the alarm and changes the pre-set flow rate of the cleaning gas in the exhaust cleaning process. The predetermined number of times (also referred to as a "pre-set number of times") described above is not limited to 5 times. It is sufficient that a tendency of the monitoring parameter can be grasped (or detected). For example, the pre-set number of times may be set to 3 times or more and 7 times or less.

Similarly, when the average value of the back pressure of the pump 244 or the average value of the rotation speed of the pump 244 in the preparation step tends to indicate the abnormal tendency continuously the pre-set number of times, which is the pre-set value of the monitoring parameters (that is, there is the abnormal tendency), the main controller 25 generates the alarm and changes the pre-set flow rate of the cleaning gas in the exhaust cleaning process.

That is, as compared with the average value of the electric current value, the average value of the rotation speed and the average value of the back pressure of the pump 244 in the preparation step of the previously performed process recipe, when at least one of the average value of the electric current value, the average value of the rotation speed and the average value of the back pressure of the pump 244 in the preparation step of the currently performed process recipe have increased (or decreased) continuously equal to or more than the pre-set number of times (that is, there is the abnormal tendency), the main controller 25 detects the abnormal tendency such as the clogging of the pipe such as the exhaust pipe 231 and the stopping of the pump such as the pump 244, generates the alarm and changes the pre-set flow rate of the cleaning gas in the exhaust cleaning process.

The embodiments are described by way of an example in which the pre-set flow rate of the cleaning gas in the exhaust cleaning process is changed when at least one of the average value of the electric current value of the pump 244, the average value of the rotation speed of the pump 244 and the average value of the back pressure of the pump 244 in the preparation step of the currently performed process recipe have increased (or decreased) continuously equal to or more than the pre-set number of times. However, the embodiments are not limited thereto. For example, the alarm may be generated when all the average values of the current value, the rotation speed, and the back pressure of the pump 244 in the preparation step of the currently performed process recipe have increased (or decreased) continuously from the average values of the current value, the rotation speed, and the back pressure of the pump 244 in the preparation step of the previously performed process recipe. Alternatively, the alarm may generated when two or more (a plurality) of the electric current value of the pump 244, the rotation speed of the pump 244 and the back pressure of the pump 244 in the preparation step of the currently performed process recipe have increased (or decreased) continuously from the average values of the current value, the rotation speed, and the back pressure of the pump 244 in the preparation step of the previously performed process recipe, and the pre-set flow rate of the cleaning gas in the exhaust cleaning process may be changed according to the alarm. Alternatively, the alarm may be generated when the average value of at least one apparatus data from the group consisting of the electric current value, the rotation speed and the back pressure of the pump 244 deviates from a threshold value continuously for the pre-set number of times, and the pre-set flow rate of the cleaning gas in the exhaust cleaning process may be changed according to the alarm. Thereby, in particular, it is possible to grasp (or detect) a tendency of the apparatus data of the exhaust device, and it is possible to detect the abnormal tendency of the components constituting the exhaust part 310.

Hereinafter, the cleaning gas pre-set flow rate changing process in the step S18 described above will be described with reference to FIGS. 9A and 9B. The cleaning gas pre-set flow rate changing process is performed (that is, the pre-set flow rate of the cleaning gas is changed) in accordance with the number of times the alarms indicating the abnormal tendency are detected.

Figure 9A:
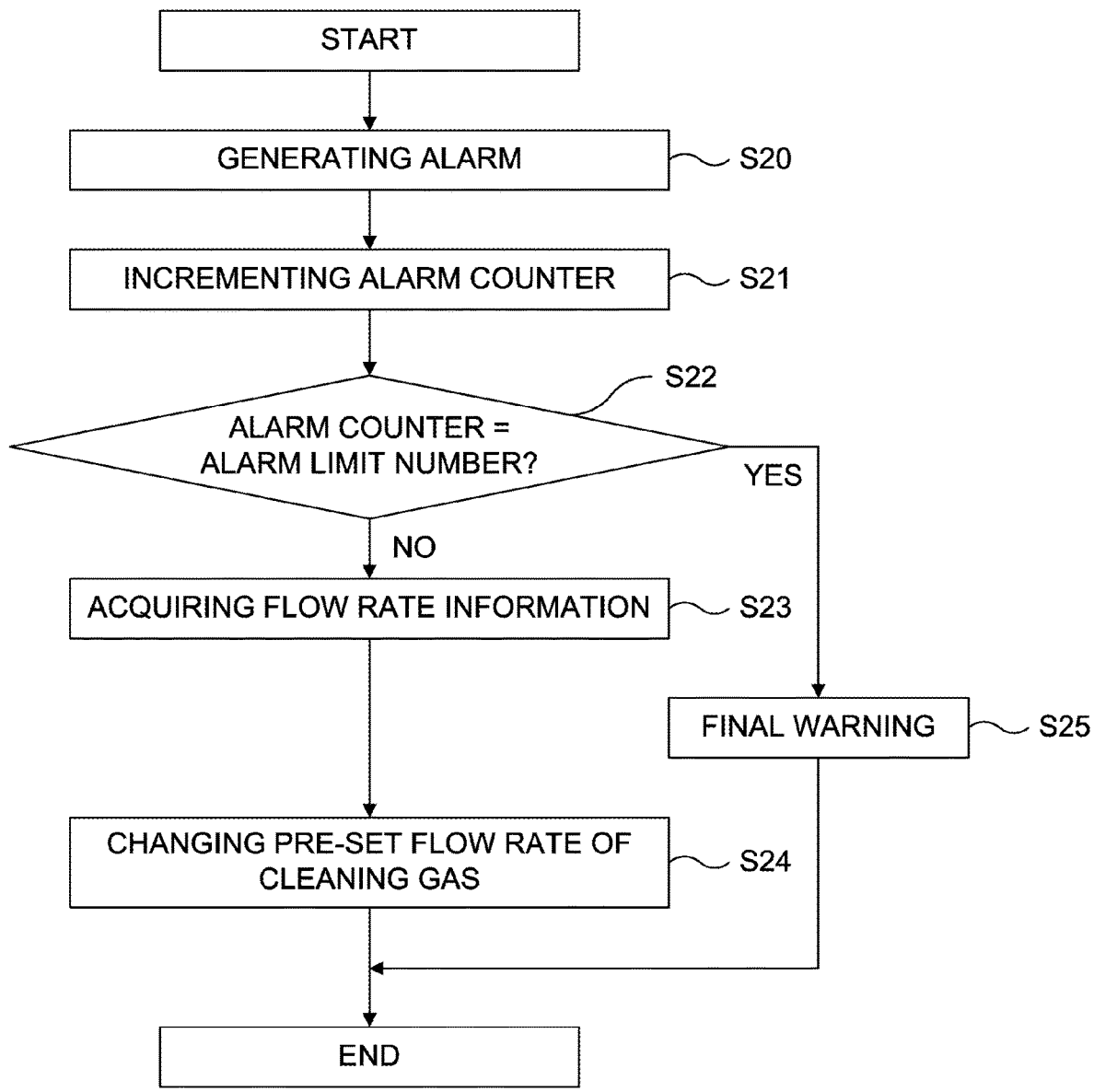
FIG. 9A schematically illustrates a control flow of a cleaning gas pre-set flow rate changing process shown in FIG. 8.
Figures 9B, 10:
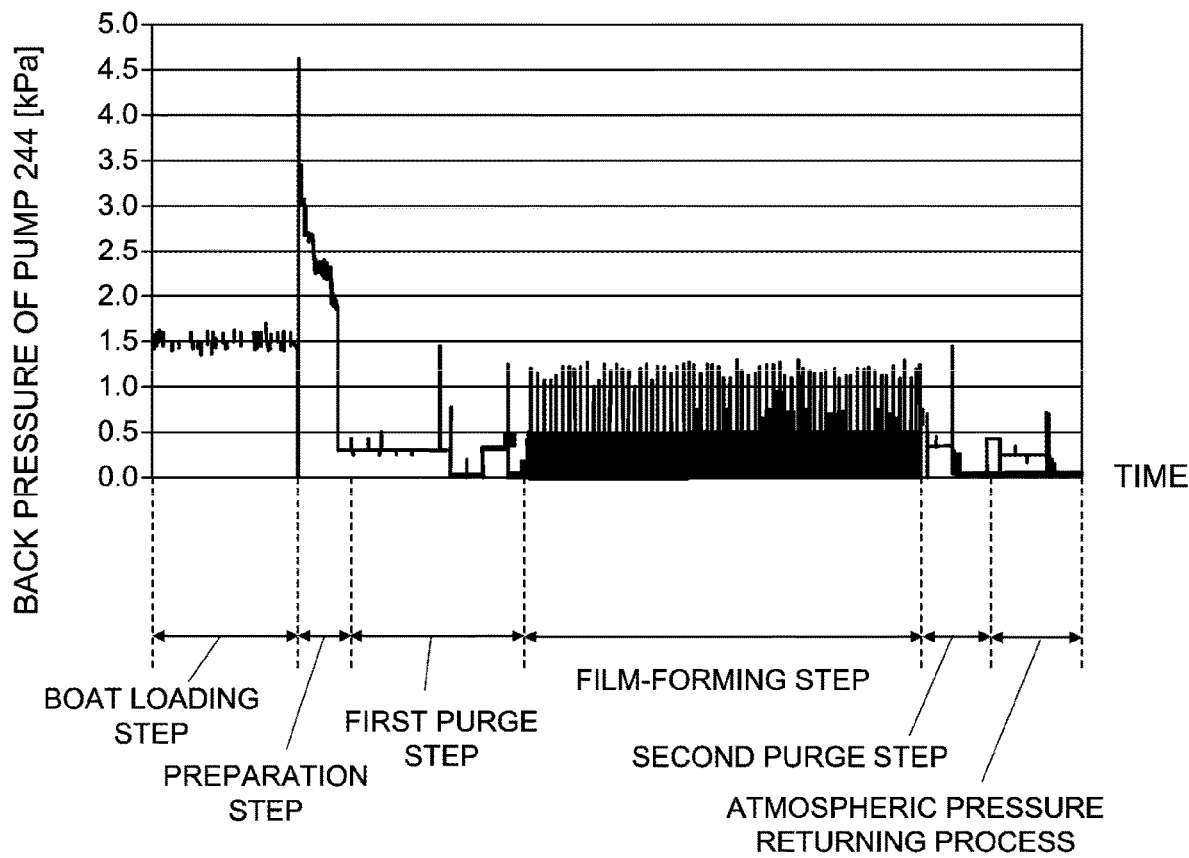
FIG. 9B schematically illustrates an example of data stored in a memory device of the substrate processing apparatus.
FIG. 10 schematically illustrates the back pressure of the auxiliary pump while performing the process recipe shown in FIGS. 8, 9A and 9B.

First, when the abnormal tendency of the exhaust part 310 is detected, the main controller 25 generates the alarm (step S20). Then, the alarm counter configured to count the number of times of the alarms generated is added (step S21). That is, the alarm counter is incremented. By displaying a message on the display device 31 that there is the sign that the pipe such as the exhaust pipe 231 is blocked (or clogged) or the pump such as the pump 244 is clogged or that the maintenance of the exhaust part 310 should be performed, or by notifying the message indicating the alarm to the host apparatus, the generated alarm is notified. Then, it is determined, for example, by the main controller 25, whether or not the added alarm counter has reached the alarm limit number set in advance (step S22). When it is determined that the alarm counter has reached the alarm limit number ("YES" in step S22), a final warning is issued that the exhaust pipe is blocked (or clogged) or the pump is clogged (step S25), and the steps shown in FIG. 9A is completed. As the final warning, for example, a message indicating that the execution of the next process recipe should be prohibited and the maintenance operation such as the replacing operation of replacing the components constituting the exhaust part 310 and the overhaul operation should be performed as soon as possible may be displayed on the display device 31, or the message is notified to the host apparatus. That is, when the abnormality of the apparatus data exceeds the threshold value, the final warning is issued to prohibit the execution of the next process recipe. Then, after the maintenance operation is performed, the alarm counter is cleared. In addition, the pre-set flow rate of the cleaning gas in the exhaust cleaning process is returned to the initial value.

When it is determined, for example by the main controller 25, that the alarm counter has not reached the alarm limit number ("NO" in step S22), based on the alarm counter (that is, the number of times the alarms generated), flow rate information of the cleaning gas set in advance is acquired from the memory device 28 (step S23). The memory device 28 stores the flow rate information of the cleaning gas in accordance with the alarm counter in advance. The, the pre-set flow rate of the cleaning gas in the exhaust cleaning process is changed (step S24), and the steps shown in FIG. 9A is completed. The main controller 25 determines the fluctuation of the average value of the acquired apparatus data from the step following the preparation step to the step before the atmospheric pressure returning process shown in FIG. 10. Therefore, according to the embodiments, it is possible to perform the exhaust cleaning process in parallel with the atmospheric pressure returning process of the process recipe.

As described above, when the abnormal tendency of the apparatus data is detected, by changing the flow rate of the cleaning gas and/or the supply time of the cleaning gas while performing the process recipe, the pre-set flow rate of the cleaning gas is changed, and the exhaust cleaning process is performed with the changed flow rate of the cleaning gas. That is, the exhaust cleaning process can be performed in accordance with the changed pre-set flow rate of the cleaning gas. As a result, by removing the by-products adhered to the exhaust device at an appropriate timing with an appropriate amount of the cleaning gas, it is possible to avoid the blockage (or clogging) of the exhaust pipe or the stopping of a pump rotor of the pump due to the clogging of the pump while suppressing the total amount of the cleaning gas. It is also possible to improve the operation rate of the apparatus by continuously performing the process recipe.

(8) Effects According to Embodiments

According to the embodiments described above, it is possible to provide one or more of the following effects.

(a) By incorporating the exhaust cleaning process into the process recipe, it is possible to supply the cleaning gas with the pre-set flow rate after each film-forming step of the process recipe, and is also possible to remove the by-products before the by-products are deposited to the exhaust device.

(b) By performing the exhaust gas cleaning step in parallel with the atmospheric pressure returning process after each film-forming step of the process recipe, it is possible to remove the by-products adhered to the exhaust device at an appropriate timing, and is also possible to improve the operation rate of the apparatus.

(c) By efficiently detecting the tendency of the monitoring parameters related to the exhaust device to detect the abnormality of the exhaust device and by increasing the pre-set flow rate of the cleaning gas when the abnormality is detected, it is possible to perform the maintenance operation before the abnormality occurs, and is also possible to improve the operation rate of the apparatus.

(d) By detecting the tendency of the monitoring parameters related to the exhaust device, for example, it is possible to detect the blockage of the exhaust device due to the by-products adhered to the inside of the exhaust device before the exhaust pipe is blocked (or clogged) or the pump rotor is stopped by the clogging of the pump.

(e) It is possible to detect the sign of the abnormality of the exhaust device to be monitored, and is also possible to notify the sign (for example, the sign indicating that the exhaust pipe is blocked or the pump rotor is stopped by the clogging of the pump) to the user by generating the alarm, displaying the alarm on the display device 31 or notifying the message indicating the alarm to the host apparatus. As a result, before the exhaust pipe is clogged or the pump rotor is stopped by the clogging of the pump, it is possible to reliably replace the components constituting the exhaust device and to perform the maintenance operation such as the overhaul operation.

(f) While performing the process recipe, it is possible to remove the by-products in the exhaust device by supplying the cleaning gas to the exhaust part while controlling the cleaning gas to bypass the process chamber. Since it is not necessary to perform a pre-process recipe such as a pre-coating process performed after a conventional cleaning recipe is completed and the process recipe is started again, it is possible to significantly improve the operation rate of the apparatus.

(g) Since the sign (for example, the sign indicating that the exhaust pipe is blocked or the pump rotor is stopped by the clogging of the pump) can be detected by comparing the average value of the apparatus data at the predetermined specific step among the steps constituting the process recipe with the average value of the apparatus data at the specific step of the previously performed process recipe, it is not necessary to set the threshold value before the final warning is issued.

Other Embodiments

While the technique is described in detail by way of the above-described embodiments, the above-described technique is not limited thereto. The above-described technique may be modified in various ways without departing from the gist thereof.

For example, the above-described embodiments are described by way of an example in which the film is formed on the wafer 200. However, the above-described technique is not limited thereto. For example, according to the above-described embodiments, the cleaning recipe of supplying the cleaning gas such as the halogen gas is performed. However, a purge gas recipe of supplying the purge gas such as the inert gas may be performed instead of the cleaning recipe or in parallel with the cleaning recipe. According to the above-described embodiments, the fluorine-containing gas is used as the halogen gas. However, a chlorine (Cl)-containing gas may be used as the halogen gas.

In addition, the concentration of the cleaning gas or the type of the cleaning gas in the exhaust cleaning process may be changed when the abnormal tendency occurs at the components constituting the exhaust part 310.

In addition, while performing the wafer discharging step after the atmospheric pressure returning process or while performing the wafer charging step of the next process recipe, the cleaning gas may be supplied to the components constituting the exhaust part 310 with the flow rate thereof adjusted to the pre-set initial value.

While the above-described embodiments are described by way of an example in which a batch type substrate processing apparatus configured to simultaneously process a plurality of substrates is used to form the film, the above-described technique is not limited thereto. In addition, while a substrate processing apparatus having a hot wall type process furnace is exemplified in the above-described embodiments, the above-described technique is not limited thereto. For example, the above-described technique may also be applied to form the film using a substrate processing apparatus having a cold wall type process furnace.

For example, the above-described embodiments are described by way of an example in which a semiconductor manufacturing apparatus configured to process a semiconductor wafer (for example, the substrate processing apparatus 100) is used. However, the above-described technique is not limited thereto. The above-described technique may be applied to an LCD (Liquid Crystal Display) manufacturing apparatus configured to process a glass substrate.

According to some embodiments in the present disclosure, it is possible to remove the by-products before the by-products are deposited to the exhaust part.

What is claimed is:

1. A method of manufacturing a semiconductor device comprising:

(a) processing a substrate while maintaining an inner pressure of a process chamber at a process pressure by operating an adjustable valve;
(b) adjusting the inner pressure of the process chamber to the process pressure before (a);
(c) changing the inner pressure of the process chamber from the process pressure to an atmospheric pressure; and
(d) supplying a predetermined gas directly to a downstream side of the adjustable valve,
wherein (d) comprises: (d-1) depressurizing an inside of a pipe located downstream of the adjustable valve while the adjustable valve is in a closed state; (d-2) supplying the predetermined gas to the pipe while the adjustable valve is in the closed state; (d-3) removing residuals of the predetermined gas from the inside of the pipe while the adjustable valve is in the closed state; and (d-4) purging the inside of the pipe with a purge gas while the adjustable valve is in the closed state,
wherein, in (b), data comprising an electric current value, a rotation speed and a back pressure of an exhaust device configured to exhaust an inner atmosphere of the process chamber is collected a plurality of times as data regarding the exhaust device,
wherein a supply amount of the predetermined gas is changed by adjusting a time duration of (d-2) according to number of times that a difference between the data regarding the exhaust device collected in (b) and the data regarding the exhaust device collected in a previous execution of (b) exceeds a threshold value, and
wherein (d-2) is performed during the adjusted time duration while (c) and (d) are performed in parallel.

2. The method of claim 1, wherein a total time of (c) is longer than a total time of (d).

3. The method of claim 1, wherein a start time of (c) is set earlier than a start time of (d).

4. The method of claim 3, wherein a gas different from the predetermined gas is supplied to the process chamber in (c).

5. The method of claim 1, wherein the predetermined gas comprises a halogen-containing gas.

6. The method of claim 1, wherein the predetermined gas comprises a cleaning gas.

7. The method of claim 1, wherein
an average value of the data regarding the exhaust device collected in (b) is calculated, and the average value is compared with an average value calculated from the data regarding the exhaust device collected in the previous execution of (b).

8. The method of claim 1, wherein the supply amount of the predetermined gas is changed by adjusting a flow rate of the predetermined gas.

9. The method of claim 1, wherein a concentration of the predetermined gas or a type of the predetermined gas is variable before (d).

10. The method of claim 1, wherein at least one of the supply amount or a concentration of the predetermined gas remains unchanged when it is determined that the difference between the data regarding the exhaust device collected in (b) and the data regarding the exhaust device collected in the previous execution of (b) is equal to or smaller than the threshold value.

11. The method of claim 1, wherein a flow rate of the predetermined gas is pre-set.

12. The method of claim 1, wherein the purge gas comprises an inert gas.

13. The method of claim 1, wherein, when the difference between the data regarding the exhaust device collected in (b) and the data regarding the exhaust device collected in the previous execution of (b) exceeds the threshold value continuously for a preset number of times, the time duration of performing (d-2) is adjusted so that (d-2) is performed during the adjusted time duration, and a subsequent cycle of (a) through (d) is prevented from being performed.

14. The method of claim 1, wherein an alarm is generated when the number of times that the difference between the data regarding the exhaust device collected in (b) and the data regarding the exhaust device collected in the previous execution of (b) exceeds the threshold value is greater than an upper limit.

15. The method of claim 1, wherein the number of times that the difference between the data regarding the exhaust device collected in (b) and the data regarding the exhaust device collected in the previous execution of (b) exceeds the threshold value is counted,
wherein the number of times is reset to zero when the difference is equal to or smaller than the threshold value before the number of times reaches a preset number of times, and
wherein the time duration of performing (d-2) is adjusted so that (d-2) is performed during the adjusted time duration when the difference between the data regarding the exhaust device collected in (b) and the data regarding the exhaust device collected in the previous execution of (b) exceeds the threshold value continuously for the preset number of times.

16. The method of claim 1, wherein a supply valve is provided at a supply pipe of the predetermined gas, and
wherein the supply valve is in a closed state while (d-1) and (d-3) are performed, and the supply valve is in an open state while (d-2) and (d-4) are performed.

17. The method of claim 1, wherein a flow rate controller is provided at a supply pipe of the predetermined gas and configured to control a flow rate of the predetermined gas, and
wherein the supply amount of the predetermined gas is changed by changing the flow rate of the predetermined gas by the flow rate controller.

18. A non-transitory computer-readable recording medium storing a program that causes, by a computer, a substrate processing apparatus to perform a process recipe, the process recipe comprising:
(a) processing a substrate while maintaining an inner pressure of a process chamber at a process pressure by operating an adjustable valve;
(b) adjusting the inner pressure of the process chamber to the process pressure before (a);
(c) changing the inner pressure of the process chamber from the process pressure to an atmospheric pressure; and
(d) supplying a predetermined gas directly to a downstream side of the adjustable valve,
wherein (d) comprises: (d-1) depressurizing an inside of a pipe located downstream of the adjustable valve while the adjustable valve is in a closed state; (d-2) supplying the predetermined gas to the pipe while the adjustable valve is in the closed state; (d-3) removing residuals of the predetermined gas from the inside of the pipe while the adjustable valve is in the closed state; and (d-4) purging the inside of the pipe with a purge gas while the adjustable valve is in the closed state,
wherein, in (b), data comprising an electric current value, a rotation speed and a back pressure of an exhaust device configured to exhaust an inner atmosphere of the process chamber is collected a plurality of times as data regarding the exhaust device, wherein a supply amount of the predetermined gas is changed by adjusting a time duration of (d-2) according to number of times that a difference between the data regarding the exhaust device collected in (b) and the data regarding the exhaust device collected in a previous execution of (b) exceeds a threshold value, and wherein (d-2) is performed during the adjusted time duration while (c) and (d) are performed in parallel.

19. A substrate processing method comprising:
(a) processing a substrate in a process chamber while maintaining an inner pressure of the process chamber at a process pressure by operating an adjustable valve;
(b) adjusting the inner pressure of the process chamber to the process pressure before (a);
(c) changing the inner pressure of the process chamber from the process pressure to an atmospheric pressure; and
(d) supplying a predetermined gas directly to a downstream side of the adjustable valve,
wherein (d) comprises: (d-1) depressurizing an inside of a pipe located downstream of the adjustable valve while the adjustable valve is in a closed state; (d-2) supplying the predetermined gas to the pipe while the adjustable valve is in the closed state; (d-3) removing residuals of the predetermined gas from the inside of the pipe while the adjustable valve is in the closed state; and (d-4) purging the inside of the pipe with a purge gas while the adjustable valve is in the closed state, wherein, in (b), data comprising an electric current value, a rotation speed and a back pressure of an exhaust device configured to exhaust an inner atmosphere of the process chamber is collected a plurality of times as data regarding the exhaust device, wherein a supply amount of the predetermined gas is changed by adjusting a time duration of (d-2) according to number of times that a difference between the data regarding the exhaust device collected in (b) and the data regarding the exhaust device collected in a previous execution of (b) exceeds a threshold value, and wherein (d-2) is performed during the adjusted time duration while (c) and (d) are performed in parallel.

* * * * *